US012579336B2

(12) United States Patent
Isaak

(10) Patent No.: US 12,579,336 B2
(45) Date of Patent: Mar. 17, 2026

(54) GEOGRAPHIC SETPOINT MATCHING SYSTEM FOR OUTDOOR STREET LIGHTING

(71) Applicant: EvariLabs LLC, San Diego, CA (US)

(72) Inventor: Ari Isaak, San Diego, CA (US)

(73) Assignee: Evarilabs LLC., San Diego, CA (US)

( * ) Notice: Subject to any disclaimer, the term of this patent is extended or adjusted under 35 U.S.C. 154(b) by 64 days.

(21) Appl. No.: 18/660,680

(22) Filed: May 10, 2024

(65) Prior Publication Data

US 2025/0348631 A1 Nov. 13, 2025

(51) Int. Cl.
*G06F 30/18* (2020.01)

(52) U.S. Cl.
CPC .................................... *G06F 30/18* (2020.01)

(58) Field of Classification Search
CPC ...... G06F 30/18; G06F 30/12; G06F 2111/00; G06F 2119/22
See application file for complete search history.

(56) References Cited

U.S. PATENT DOCUMENTS

| | | |
|---|---|---|
| 9,907,147 B2 | 2/2018 | Chen et al. |
| 2013/0057158 A1 | 3/2013 | Josefowicz et al. |
| 2013/0285556 A1 | 10/2013 | Challapali et al. |
| 2014/0239808 A1 | 8/2014 | Nava et al. |
| 2014/0265874 A1 | 9/2014 | Marquardt et al. |
| 2014/0285107 A1 | 9/2014 | Cavalcanti et al. |

(Continued)

FOREIGN PATENT DOCUMENTS

| | | |
|---|---|---|
| EP | 3232741 B1 | 10/2017 |
| EP | 3914049 A | 11/2021 |

(Continued)

OTHER PUBLICATIONS

Leszek Kotulski1, Jeroen De Landtsheer2, Sven Penninck2 , Adam Sdziwy1 , Igor Wojnicki1 , "Supporting energy efficiency optimization in lighting design process" , pp. 1-11, 2013 (Year: 2013).*
Qi Yao, Hongbing Wang, Jim Uttley, and Xiaobo Zhuang, "Illuminance Reconstruction of Road Lighting in Urban Areas for Efficient and Healthy Lighting Performance Evaluation",pp. 1-18, (Year: 2018).*
J. Ren, Y. Li, H. Liu, K. Li, D. Hao, Z. Wang, "Analysis of Light Obstruction from Street Lighting in Road Scenes", pp. 1-20, 2023. (Year: 2023).*

(Continued)

*Primary Examiner* — Kibrom K Gebresilassie
(74) *Attorney, Agent, or Firm* — John L. Rogitz; John M. Rogitz

(57) ABSTRACT

Computer-based systems are disclosed that provide technological advances in electronic setpoint management and infrastructure. Present principles may be applied to streetlight configuration and management as well as to other applied technologies. Thus, in one aspect an apparatus includes a processor and storage with instructions. The instructions are executable to identify substantive performance data for a device, access setpoint data associated the device, and compare the substantive performance data to the setpoint data to determine a difference between the substantive setpoint data and the setpoint data. The instructions are also executable to correlate the difference to a particular configuration for the device. The instructions are then executable to store the substantive performance data, setpoint data, and the particular configuration for the device. The stored data is then used for training a machine learning model, which is then deployed to infer additional configurations for smart streetlights and other smart devices.

20 Claims, 24 Drawing Sheets

(56) References Cited

U.S. PATENT DOCUMENTS

| | | |
|---|---|---|
| 2015/0102747 A1 | 4/2015 | Wang et al. |
| 2016/0007429 A1 | 1/2016 | Eskonen et al. |
| 2016/0050397 A1 | 2/2016 | Di Giamberardino et al. |
| 2016/0273726 A1 | 9/2016 | Adler |
| 2017/0303372 A1* | 10/2017 | Isaak ..................... G05D 25/02 |
| 2022/0272815 A1 | 8/2022 | Rebernig et al. |

FOREIGN PATENT DOCUMENTS

| | | | |
|---|---|---|---|
| KR | 2618714 | B1 | 12/2023 |
| WO | 2012140152 | A1 | 10/2012 |
| WO | 2023222424 | A1 | 11/2023 |

OTHER PUBLICATIONS

"International Search Report and Written Opinion", dated Jul. 9, 2025, from the counterpart PCT application PCT/US25/026993.

Isaak, Ari, "Street and Roadway Lighting Distribution Map", file history of related U.S. Appl. No. 15/098,660, now U.S. Pat. No. 9,894,736, issued Feb. 13, 2018.

S. Kumar, A. Deshpande, S. S. Ho, J. S. Ku and S. E. Sarma, "Urban Street Lighting Infrastructure Monitoring Using a Mobile Sensor Platform," in IEEE Sensors Journal, vol. 16, No. 12, pp. 4981-4994, Jun. 15, 2016.

* cited by examiner

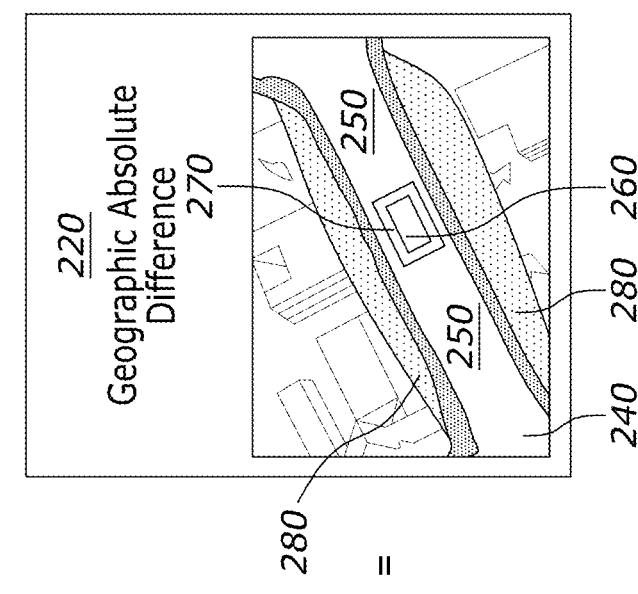
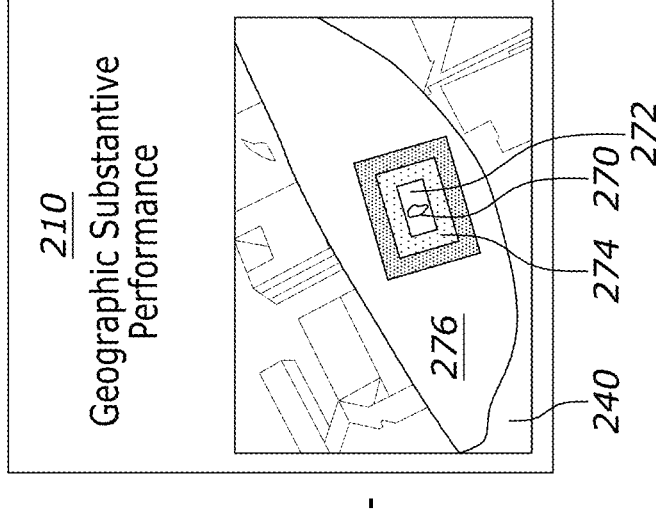
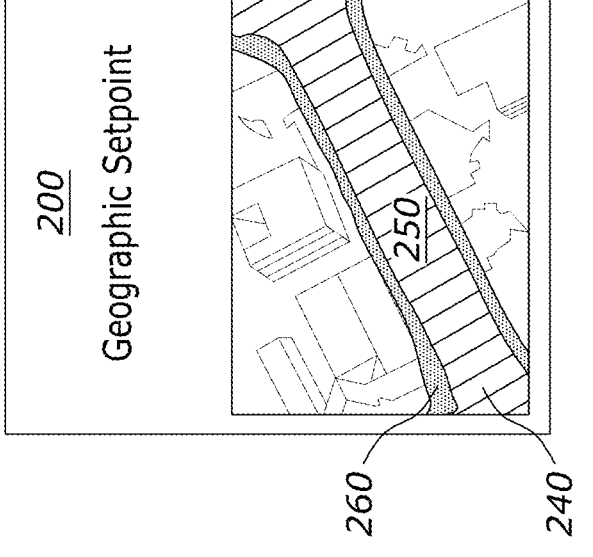
FIG. 2

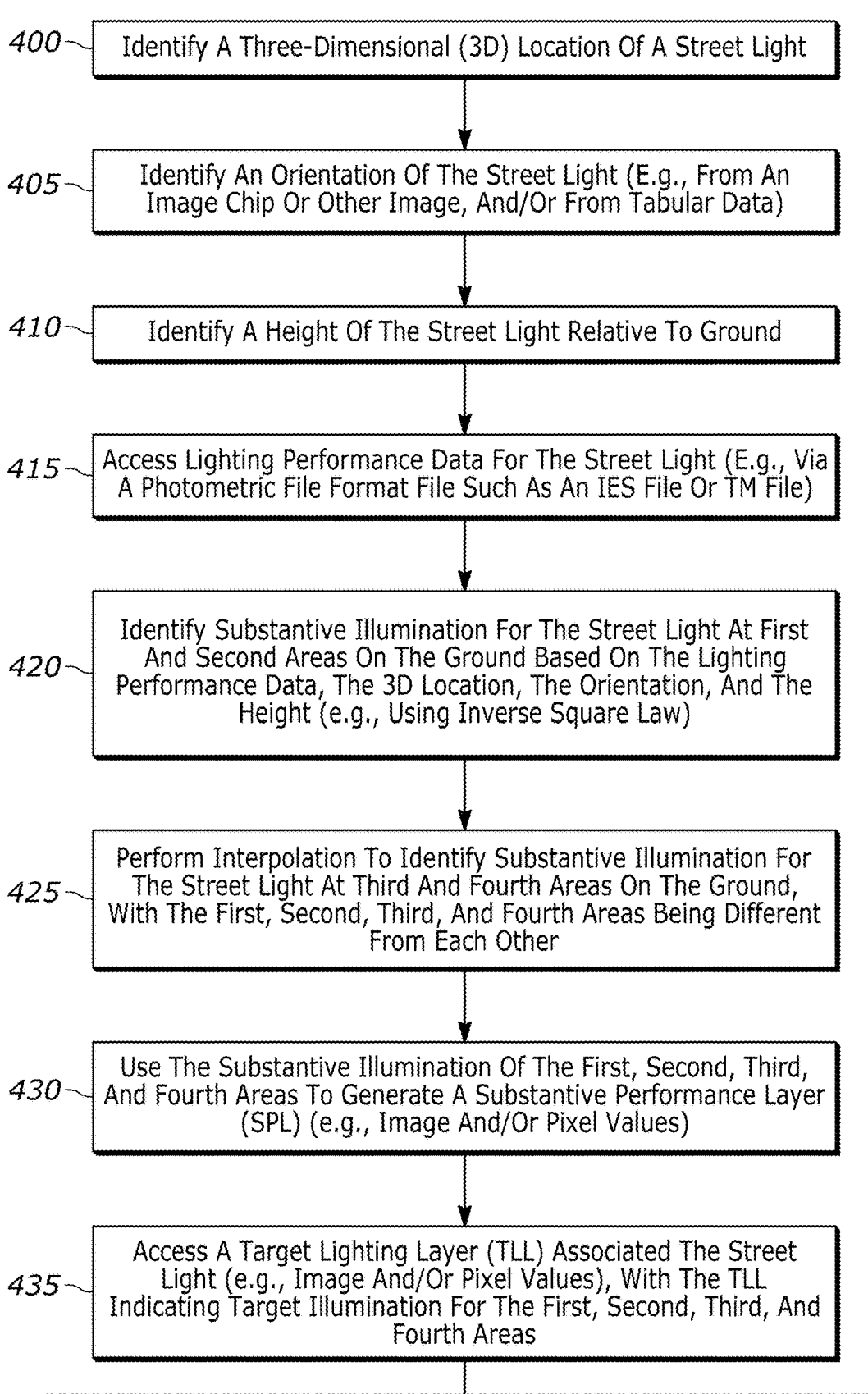

400 — Identify A Three-Dimensional (3D) Location Of A Street Light

405 — Identify An Orientation Of The Street Light (E.g., From An Image Chip Or Other Image, And/Or From Tabular Data)

410 — Identify A Height Of The Street Light Relative To Ground

415 — Access Lighting Performance Data For The Street Light (E.g., Via A Photometric File Format File Such As An IES File Or TM File)

420 — Identify Substantive Illumination For The Street Light At First And Second Areas On The Ground Based On The Lighting Performance Data, The 3D Location, The Orientation, And The Height (e.g., Using Inverse Square Law)

425 — Perform Interpolation To Identify Substantive Illumination For The Street Light At Third And Fourth Areas On The Ground, With The First, Second, Third, And Fourth Areas Being Different From Each Other 430 — Use The Substantive Illumination Of The First, Second, Third, And Fourth Areas To Generate A Substantive Performance Layer (SPL) (e.g., Image And/Or Pixel Values)

435 — Access A Target Lighting Layer (TLL) Associated The Street Light (e.g., Image And/Or Pixel Values), With The TLL Indicating Target Illumination For The First, Second, Third, And Fourth Areas

FIG. 4

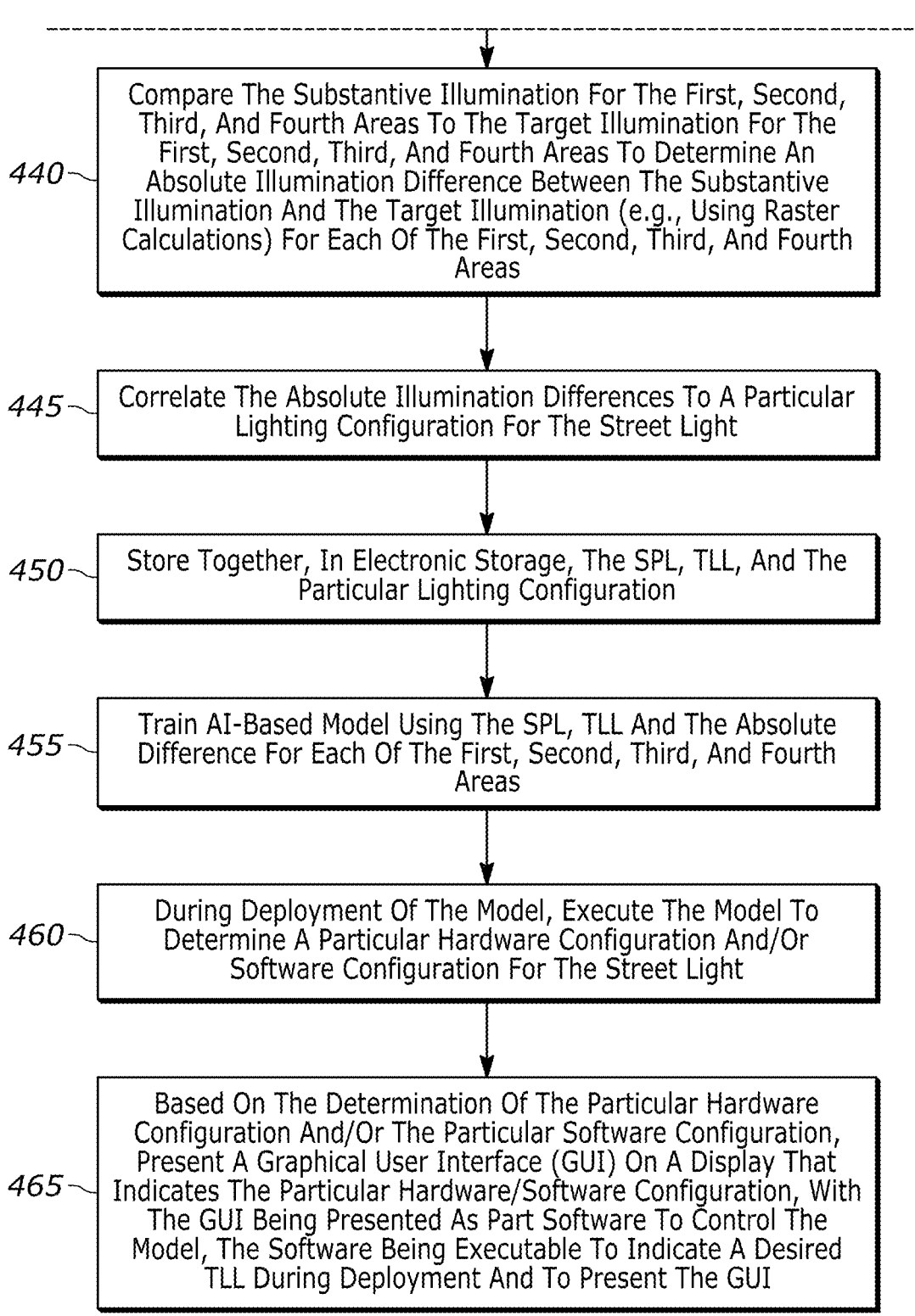

440 — Compare The Substantive Illumination For The First, Second, Third, And Fourth Areas To The Target Illumination For The First, Second, Third, And Fourth Areas To Determine An Absolute Illumination Difference Between The Substantive Illumination And The Target Illumination (e.g., Using Raster Calculations) For Each Of The First, Second, Third, And Fourth Areas 445 — Correlate The Absolute Illumination Differences To A Particular Lighting Configuration For The Street Light 450 — Store Together, In Electronic Storage, The SPL, TLL, And The Particular Lighting Configuration 455 — Train AI-Based Model Using The SPL, TLL And The Absolute Difference For Each Of The First, Second, Third, And Fourth Areas 460 — During Deployment Of The Model, Execute The Model To Determine A Particular Hardware Configuration And/Or Software Configuration For The Street Light 465 — Based On The Determination Of The Particular Hardware Configuration And/Or The Particular Software Configuration, Present A Graphical User Interface (GUI) On A Display That Indicates The Particular Hardware/Software Configuration, With The GUI Being Presented As Part Software To Control The Model, The Software Being Executable To Indicate A Desired TLL During Deployment And To Present The GUI

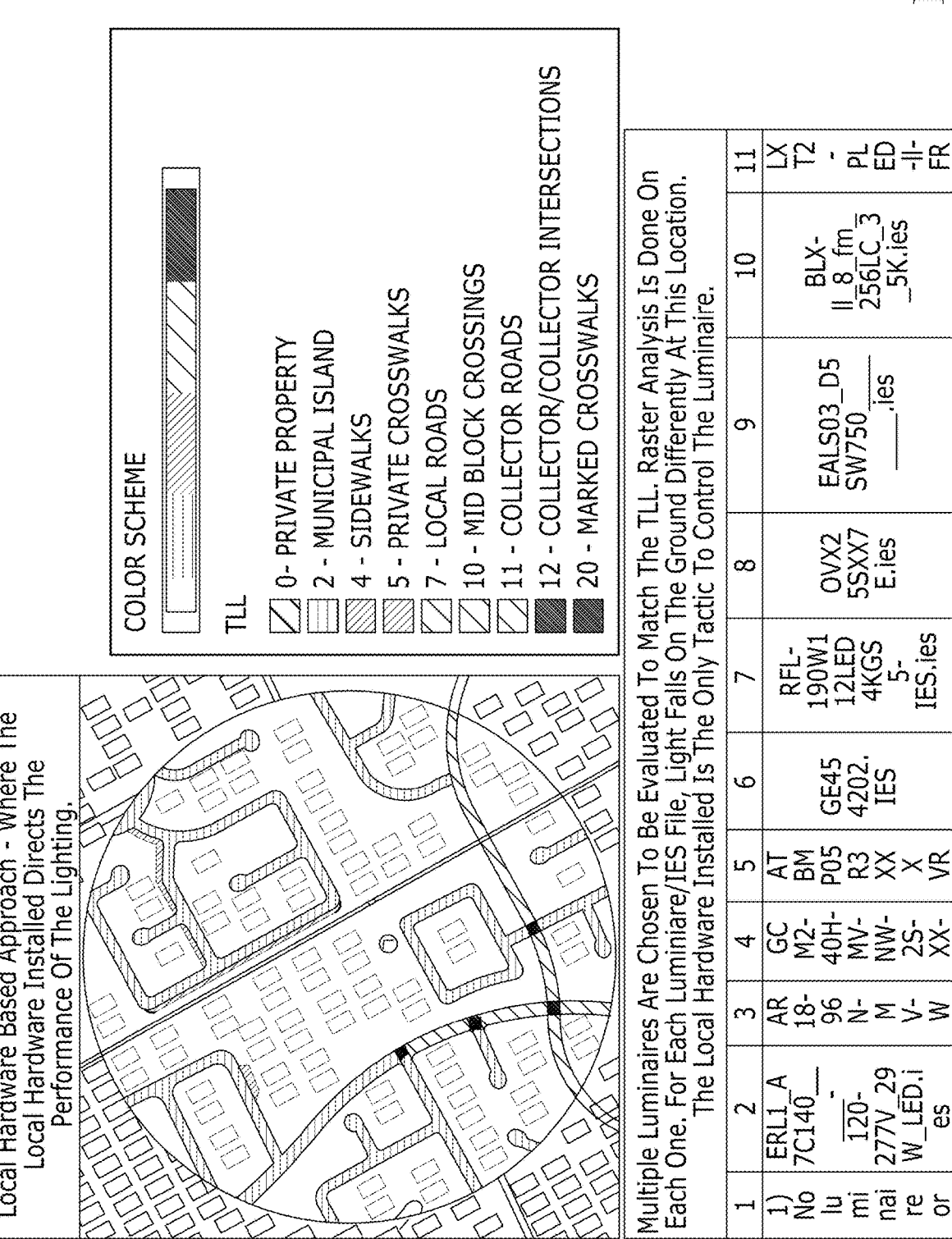

FIG. 11A

Local Hardware Based Approach - Where The Local Hardware Installed Directs The Performance Of The Lighting.

COLOR SCHEME

TLL

0 - PRIVATE PROPERTY
2 - MUNICIPAL ISLAND
4 - SIDEWALKS
5 - PRIVATE CROSSWALKS
7 - LOCAL ROADS
10 - MID BLOCK CROSSINGS
11 - COLLECTOR ROADS
12 - COLLECTOR/COLLECTOR INTERSECTIONS
20 - MARKED CROSSWALKS

Multiple Luminaires Are Chosen To Be Evaluated To Match The TLL. Raster Analysis Is Done On Each One. For Each Luminaire/IES File, Light Falls On The Ground Differently At This Location. The Local Hardware Installed Is The Only Tactic To Control The Luminaire.

| 1 | 2 | 3 | 4 | 5 | 6 | 7 | 8 | 9 | 10 | 11 |
|---|---|---|---|---|---|---|---|---|----|----|
| 1) No lumi nai re or | ERL1_A 7C140_ - 120- 277V_29 W_LED.i es | AR 18- 96 N- M V- W | GC M2- 40H- MV- NW- 2S- XX- | AT BM P05 R3 XX X VR | GE45 4202. IES | RFL- 190W1 12LED 4KGS 5- IES.ies | OVX2 5SXX7 E.ies | EALS03_D5 SW750 ____.ies | BLX- II_8_fm_ 256LC_3 _5K.ies | LX T2 - PL ED -II- FR |

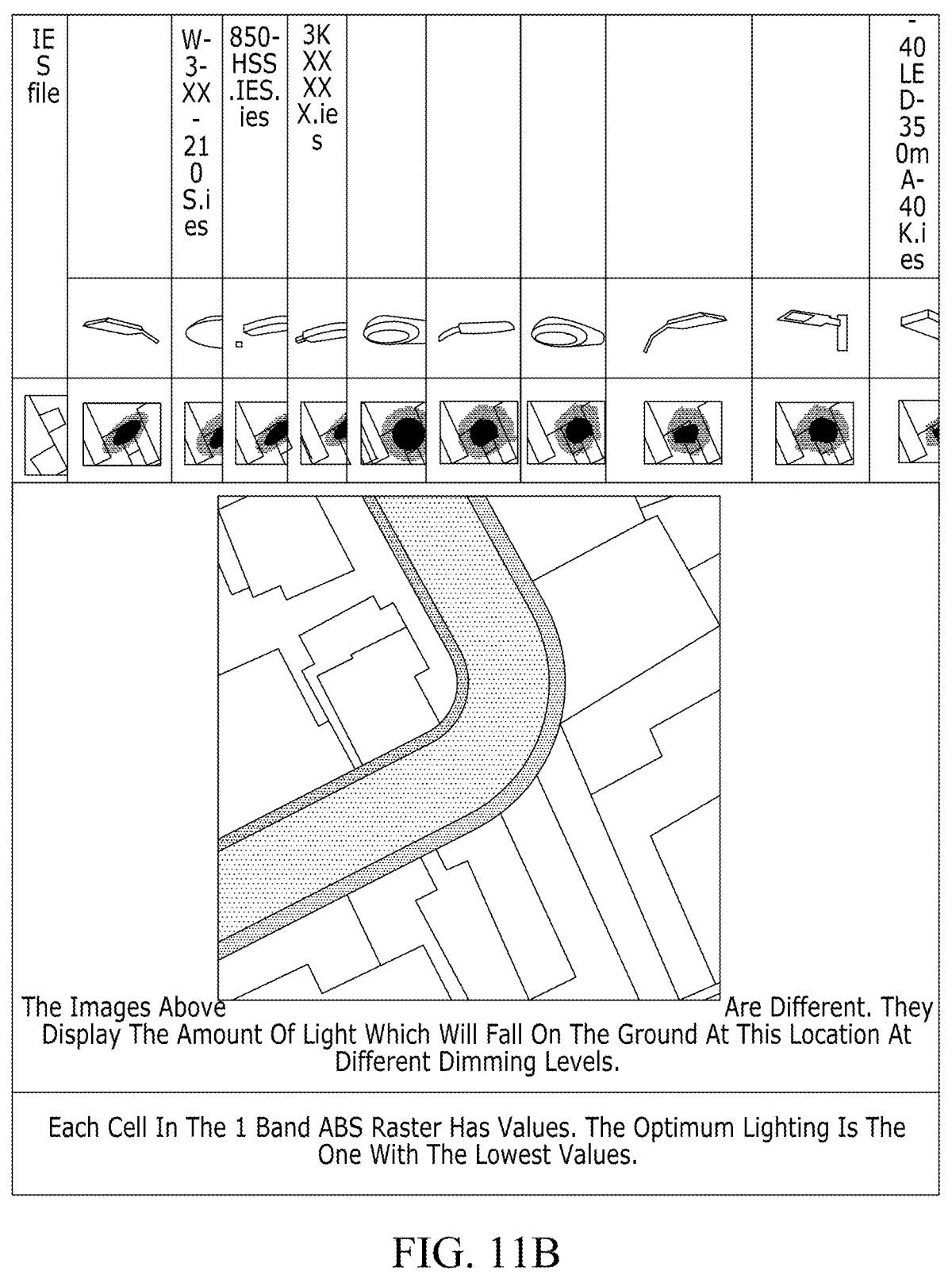

| IES file | | W-3-XX-210S.ies | 850-HSS.IES.ies | 3KXXXXX.ies | | | | | | -40LED-350mA-40K.ies |
|---|---|---|---|---|---|---|---|---|---|---|

The Images Above Are Different. They Display The Amount Of Light Which Will Fall On The Ground At This Location At Different Dimming Levels.

Each Cell In The 1 Band ABS Raster Has Values. The Optimum Lighting Is The One With The Lowest Values.

FIG. 11B

In The Image Above We Used 10 IES Files And 1 No Fixture
Installed Option To Determine The Luminiare/IES File Which Most
Closely Matches The Target Lighting Layer At Each Location. The
Numbers Above Match The Chosen Luminaire/IES Files.

ERL1_A7C140_
___-120-277V_2
9W_LED Dimmed
To 60% Power

The Steps Above Show How To Run This For A Single Light. Model Can Run This For All Lights In Project To Determine The Optimum Lighting Level 6496_4x6497_1.tif

| | | | | |
|---|---|---|---|---|
| 6496_0x6497_0 | 6496_0x6497_1 | 6496_0x6497_3 | 6496_0x6497_5 | 6496_0x6497_7 | 6496_0x6497_9 |
| 6496_1x6497_0 | 6496_1x6497_1 | 6496_1x6497_3 | 6496_1x6497_5 | 6496_1x6497_7 | 6496_1x6497_9 |
| 6496_2x6497_0 | 6496_2x6497_2 | 6496_2x6497_3 | 6496_2x6497_5 | 6496_2x6497_7 | 6496_2x6497_9 |
| 6496_3x6497_0 | 6496_3x6497_2 | 6496_3x6497_3 | 6496_3x6497_5 | 6496_3x6497_7 | 6496_3x6497_9 |
| 6496_4x6497_0 | 6496_4x6497_2 | 6496_4x6497_3 | 6496_4x6497_5 | 6496_4x6497_7 | 6496_4x6497_9 |
| 6496_5x6497_0 | 6496_5x6497_2 | 6496_5x6497_3 | 6496_5x6497_5 | 6496_5x6497_7 | 6496_5x6497_9 |
| 6496_6x6497_0 | 6496_6x6497_2 | 6496_6x6497_3 | 6496_6x6497_5 | 6496_6x6497_7 | 6496_6x6497_9 |
| 6496_7x6497_0 | 6496_7x6497_2 | 6496_7x6497_3 | 6496_7x6497_5 | 6496_7x6497_7 | 6496_7x6497_9 |
| 6496_8x6497_0 | 6496_8x6497_2 | 6496_8x6497_3 | 6496_8x6497_5 | 6496_8x6497_7 | 6496_8x6497_9 |
| 6496_9x6497_0 | 6496_9x6497_2 | 6496_9x6497_3 | 6496_9x6497_5 | 6496_9x6497_7 | 6496_9x6497_9 |
| 6496_10x6497_0 | 6496_10x6497_2 | 6496_10x6497_3 | 6496_10x6497_5 | 6496_10x6497_7 | 6496_10x6497_9 |
| 6496_0x6497_0 | 6496_0x6497_2 | 6496_0x6497_4 | 6496_0x6497_6 | 6496_0x6497_8 | 6496_0x6497_10 |
| 6496_1x6497_1 | 6496_1x6497_2 | 6496_1x6497_4 | 6496_1x6497_6 | 6496_1x6497_8 | 6496_1x6497_10 |
| 6496_2x6497_1 | 6496_2x6497_2 | 6496_2x6497_4 | 6496_2x6497_6 | 6496_2x6497_8 | 6496_2x6497_10 |
| 6496_3x6497_1 | 6496_3x6497_2 | 6496_3x6497_4 | 6496_3x6497_6 | 6496_3x6497_8 | 6496_3x6497_10 |

FIG. 16A (Continued)

| 6496_4x6497_1 | 6496_4x6497_2 | 6496_4x6497_4 | 6496_4x6497_6 | 6496_4x6497_8 | 6496_4x6497_10 |
|---|---|---|---|---|---|
| 6496_5x6497_1 | 6496_5x6497_2 | 6496_5x6497_4 | 6496_5x6497_6 | 6496_5x6497_8 | 6496_5x6497_10 |
| 6496_6x6497_1 | 6496_6x6497_2 | 6496_6x6497_4 | 6496_6x6497_6 | 6496_6x6497_8 | 6496_6x6497_10 |
| 6496_7x6497_1 | 6496_7x6497_2 | 6496_7x6497_4 | 6496_7x6497_6 | 6496_7x6497_8 | 6496_7x6497_10 |
| 6496_8x6497_1 | 6496_8x6497_2 | 6496_8x6497_4 | 6496_8x6497_6 | 6496_8x6497_8 | 6496_8x6497_10 |
| 6496_9x6497_1 | 6496_9x6497_2 | 6496_9x6497_4 | 6496_9x6497_6 | 6496_9x6497_8 | 6496_9x6497_10 |
| 6496_10x6497_1 | 6496_10x6497_2 | 6496_10x6497_4 | 6496_10x6497_6 | 6496_10x6497_8 | 6496_10x6497_10 |

FIG. 16B

| | | | |
|---|---|---|---|
| Local Hardware | AR18-96N-MV-WW-3-XX-210 S.ies | ERL1_A7C140___-120-277V_29W_LED | LXT2-PLED-II-FR-40 LED-350mA-40K.ies |
| Remote Software | ERL1_A7C140___ ___-120-277V_2 9W_LED Run At 72% Power | ERL1_A7C140___ ___-120-277V_2 9W_LED Run At 74% Power | ERL1_A7C140___ ___-120-277V_2 9W_LED Run At 71% Power |

| | | | |
|---|---|---|---|
| Image Chip | | | |
| Label | ERL1_A7C140___ ___-120-277V_2 9W_LED Run At 72% Power | ERL1_A7C140___ ___-120-277V_2 9W_LED Run At 74% Power | ERL1_A7C140___ ___-120-277V_2 9W_LED Run At 71% Power |

GEOGRAPHIC SETPOINT MATCHING SYSTEM FOR OUTDOOR STREET LIGHTING

FIELD

The disclosure below relates to technically inventive, non-routine solutions that are necessarily rooted in computer technology and that produce concrete technical improvements. In particular, the disclosure below relates to setpoint matching systems for outdoor street lighting and other areas of technology.

BACKGROUND

As recognized herein, current computing systems cannot adequately design and manage smart streetlights because their processing capabilities and back-end systems are severely limited by existing technologies. No adequate solutions currently exist to the foregoing technological problem.

SUMMARY

Accordingly, in one aspect an apparatus includes a processor system and storage accessible to the processor system. The storage includes instructions executable by the processor system to identify a three-dimensional (3D) location of a streetlight, identify an orientation of the streetlight, identify a height of the streetlight relative to ground, and access lighting performance data for the streetlight. The instructions are also executable to identify substantive illumination for the streetlight at first and second areas on the ground based on the lighting performance data, the 3D location, the orientation, and the height. The instructions are further executable to perform interpolation to identify substantive illumination for the streetlight at third and fourth areas on the ground, where the first, second, third, and fourth areas are different from each other. Still further, the instructions are executable to use the substantive illumination of the first, second, third, and fourth areas to generate a substantive performance layer (SPL), and to access a target lighting layer (TLL) associated with the streetlight. The TLL indicates target illumination for the first, second, third, and fourth areas. The instructions are also executable to compare the substantive illumination for the first, second, third, and fourth areas to the target illumination for the first, second, third, and fourth areas to determine an absolute illumination difference between the substantive illumination and the target illumination for each of the first, second, third, and fourth areas. The instructions are then executable to correlate the absolute illumination differences to a particular lighting configuration for the streetlight. The instructions are then executable to store together, in electronic storage, the SPL, TLL, and the particular lighting configuration.

Thus, in one example embodiment, the particular lighting configuration for the streetlight may relate to a particular luminaire to use for the streetlight, and/or may relate to a particular software configuration to use for a luminaire of the streetlight.

Also in example embodiments, the instructions may be executable to determine the absolute illumination differences using raster calculations. Thus, in one specific instance the SPL may establish a first image, and the TLL may establish a second image, with the first and second images being used for the raster calculations. Also in one specific instance, the SPL may establish a first pixel value, and the TLL may establish a second pixel value, with the first and second pixel values being used for the raster calculations.

If desired, the SPL may pertain to horizontal illumination. Also if desired, the lighting performance data may pertain to light intensity for the for the streetlight. Additionally or alternatively, the lighting performance data may pertain to light color for the streetlight and/or to distribution for the streetlight.

In various examples, the orientation of the streetlight may be identified from an image chip and/or tabular data.

Still further, in some cases the lighting performance data may be accessed via a file in a photometric file format.

What's more, in some non-limiting examples, the instructions may be executable to use the inverse square law to identify the illumination for the streetlight at first and second areas on the ground.

In some instances, the instructions may also be executable to train a model using the SPL, TLL, and the absolute difference for each of the first, second, third, and fourth areas. If desired, the instructions may be further executable to, during deployment of the model, execute the model to determine a particular hardware configuration for the streetlight and/or to determine a particular software configuration for the streetlight. Further still, in some specific examples the instructions may be executable to, based on the determination of both the particular hardware configuration and the particular software configuration, present a graphical user interface (GUI) on a display. The GUI may indicate the particular hardware configuration and the particular software configuration, and the GUI may be presented as part software to control the model. The software itself may be executable to indicate a desired TLL during deployment and to present the GUI.

In another aspect, a method includes identifying a three-dimensional (3D) location of a streetlight, identifying an orientation of the streetlight, identifying a height of the streetlight relative to ground, and accessing lighting performance data for the streetlight. Based on the lighting performance data, the 3D location, the orientation, and the height, the method includes identifying substantive illumination for the streetlight at first and second areas on the ground. The method then includes performing interpolation to identify substantive illumination for the streetlight at third and fourth areas on the ground, with the first, second, third, and fourth areas being different from each other. The method then includes using the substantive illumination of the first, second, third, and fourth areas to generate a substantive performance layer (SPL). Thereafter, the method includes accessing a target lighting layer (TLL) associated the streetlight, with the TLL indicating target illumination for the first, second, third, and fourth areas. The method then includes comparing the substantive illumination for the first, second, third, and fourth areas to the target illumination for the first, second, third, and fourth areas to determine an absolute illumination difference between the substantive illumination and the target illumination for each of the first, second, third, and fourth areas. The method then includes correlating the absolute illumination differences to a particular lighting configuration for the streetlight and then storing together, in electronic storage, the SPL, TLL, and the particular lighting configuration.

In still another aspect, an apparatus includes at least one computer readable storage medium (CRSM) that is not a transitory signal. The at least one CRSM includes instructions executable by a processor system to identify substantive performance data for a device, access setpoint data associated the device, and compare the substantive perfor-mance data to the setpoint data to determine a difference between the substantive setpoint data and the setpoint data. The instructions are also executable to correlate the differ-ence to a particular configuration for the device. The instruc-tions are then executable to store together, in electronic storage, the substantive performance data, setpoint data, and the particular configuration for the device.

The details of the present application, both as to its structure and operation, can be best understood in reference to the accompanying drawings, in which like reference numerals refer to like parts, and in which:

BRIEF DESCRIPTION OF THE DRAWINGS

FIG. 2 is a schematic diagram consistent with present principles that illustrates a geographic setpoint for a street-light, geographic substantive performance of the streetlight, and the absolute difference between the two;

FIG. 4 illustrates example logic in example flow chart format that may be executed by one or more computing devices consistent with present principles;

FIGS. 11A-11C are schematic diagrams and accompany-ing tables showing various aspects of a first example imple-mentation consistent with present principles;

FIGS. 16A and 16B show an example tif file and different streetlight configuration permutations consistent with pres-ent principles;

DETAILED DESCRIPTION

Figure 1:
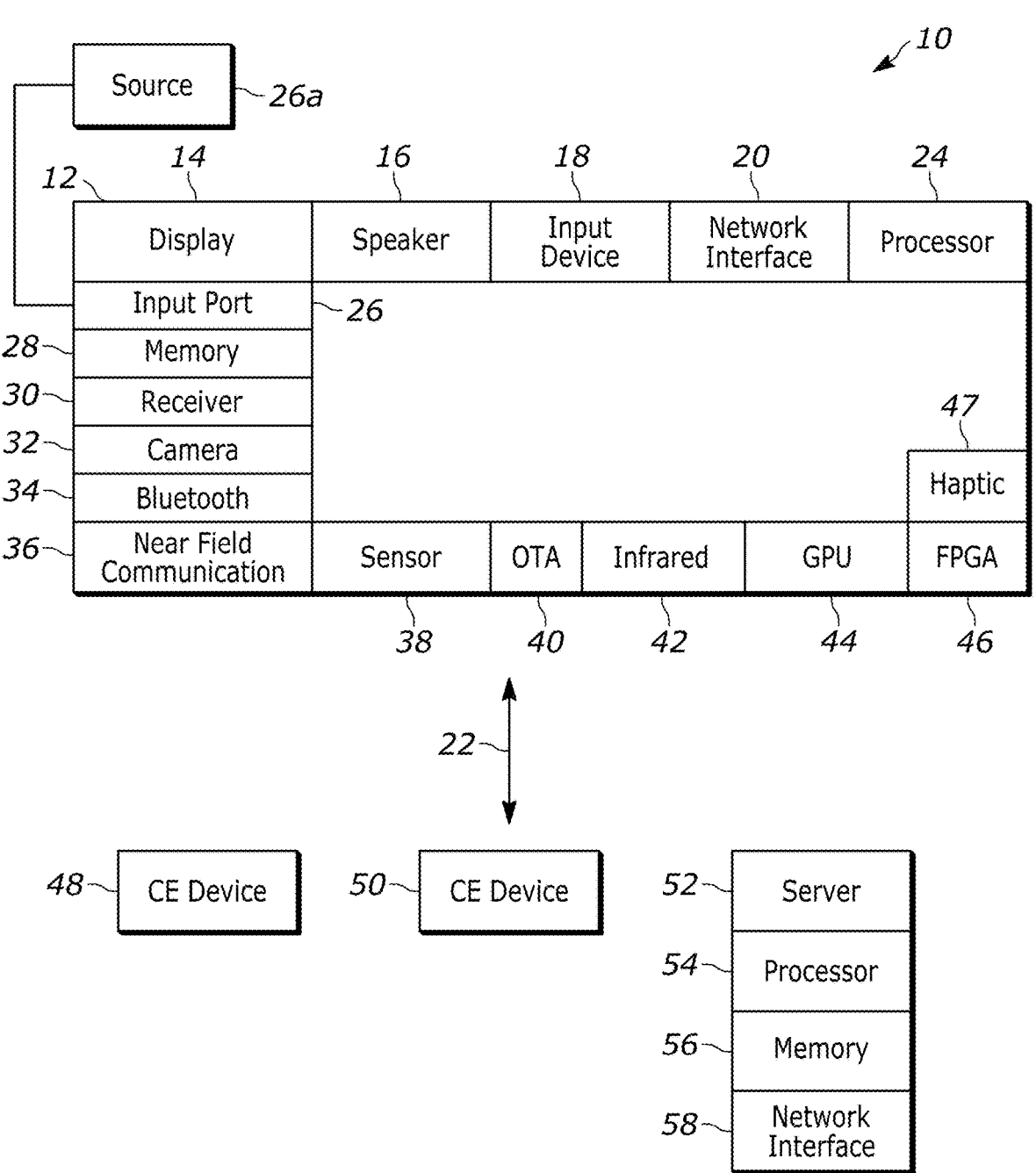
FIG. 1 is a block diagram of an example computing system consistent with present principles.

This disclosure relates generally to aspects of consumer electronics (CE) devices and other types of client devices and servers. Thus, devices herein may include server and client components which may be connected over a network such that data may be exchanged between the client and server components. The client components may include one or more computing devices including mobile smart phones and other mobile devices, wearable devices, game consoles, extended reality (XR) headsets such as virtual reality (VR) headsets and augmented reality (AR) headsets, display devices such as televisions (e.g., smart TVs, Internet-en-abled TVs), personal computers such as laptops, desktop, and tablet computers, and still other types of devices. These client devices may operate with a variety of operating environments. For example, a client device consistent with present principles may employ, as examples, Linux and Unix operating systems, operating systems from Microsoft, or operating systems from Apple or Google. These operating environments may be used to execute one or more browsing programs, such as a browser made by Microsoft, Apple, Google, or Mozilla. The operating environments may also be used to execute other Internet-networked dedicated mobile applications that can access websites hosted by the Internet servers over a network such as the Internet, a local intranet, or a virtual private network.

Servers and/or gateways may be used that may include one or more processors executing instructions that configure the servers to receive and transmit data over a network such as the Internet. Or a client and server can be connected over a local intranet or a virtual private network. A server or controller may be instantiated by a personal computer, mobile device, rack or blade server, etc.

As indicated above, information may be exchanged over a network between client devices and servers. To this end and for security, servers and/or clients can include firewalls, load balancers, temporary storages, and proxies, and other network infrastructure for reliability and security.

As used herein, instructions may refer to computer-implemented steps for processing information in the system. Instructions can be implemented in software, firmware or hardware, or combinations thereof and include any type of programmed steps undertaken by components of the system.

A processor may be any single- or multi-chip processor that can execute logic by means of various lines such as address lines, data lines, and control lines and registers and shift registers. Moreover, any logical blocks, modules, and circuits described below can be implemented or performed with a processor/processor system such as a central process-ing unit (CPU), a digital signal processor (DSP), a field programmable gate array (FPGA) or other programmable logic device, an application specific integrated circuit (ASIC), discrete gate or transistor logic, discrete hardware components, or any combination thereof designed to per-form the functions described herein. A processor can be implemented by a controller or state machine or a combi-nation of computing devices.

Software modules described by way of the flow charts and user interfaces herein can include various sub-routines, procedures, etc. Without limiting the disclosure, logic stated to be executed by a particular module can be redistributed to other software modules and/or combined together in a single module and/or made available in a shareable library.

The functions and methods described below, when implemented in software, can be written in an appropriate language such as but not limited to C# or C++, and can be stored on or transmitted from a computer-readable storage medium such as a hard disk drive (HDD) or solid state drive (SSD), random access memory (RAM), read-only memory (ROM), electrically erasable programmable read-only memory (EEPROM), compact disk read-only memory (CD-ROM) or other optical disk storage such as digital versatile disc (DVD), magnetic disk storage or other magnetic storage devices including removable thumb drives, etc. A connection may establish a computer-readable medium. Such connections can include, as examples, hard-wired cables including fiber optics and coaxial wires and digital subscriber line (DSL) and twisted pair wires.

In an example, a processor system can access information over its input lines from data storage, such as a computer readable storage medium as referenced above, and/or the processor system can access information wirelessly from an Internet server by activating a wireless transceiver to send and receive data. Data typically is converted from analog signals to digital by circuitry between the antenna and the registers of the processor system when being received and from digital to analog when being transmitted. The processor system then processes the data through its shift registers to output calculated data on output lines, for presentation of the calculated data on the device, etc.

Components included in one embodiment can be used in other embodiments in any appropriate combination. For example, any of the various components described herein and/or depicted in the Figures may be combined, interchanged, or excluded from other embodiments.

"A system having at least one of A, B, and C" (likewise "a system having at least one of A, B, or C" and "a system having at least one of A, B, C") includes systems that have A alone, B alone, C alone, A and B together, A and C together, B and C together, and/or A, B, and C together.

The term "a" or "an" in reference to an entity refers to one or more of that entity. As such, the terms "a" or "an", "one or more", and "at least one" can be used interchangeably herein.

The term "circuit" or "circuitry" may be used in the summary, description, and/or claims. The term "circuitry" includes all levels of available integration, e.g., from discrete logic circuits to the highest level of circuit integration such as VLSI, and includes programmable logic components programmed to perform the functions of an embodiment as well as processors (e.g., special-purpose processors) programmed with instructions to perform those functions.

Note that present principles may also employ machine learning models, including deep learning models. Machine learning models use various algorithms trained in ways that include supervised learning, unsupervised learning, semi-supervised learning, reinforcement learning, feature learning, self-learning, and other forms of learning. Examples of such algorithms, which can be implemented by computer circuitry, include one or more neural networks, such as one or more convolutional neural networks (CNNs) and/or one or more recurrent neural networks (RNNs) (such as a type of RNN known as a long short-term memory (LSTM) network). Support vector machines (SVM) and Bayesian networks also may be considered to be examples of machine learning models.

As understood herein, performing machine learning involves accessing and then training a model on training data to enable the model to process further data to make predictions. A neural network may include an input layer, an output layer, and multiple hidden layers in between that are configured and weighted to make inferences about an appropriate output.

Referring now to FIG. 1, an example system 10 is shown, which may include one or more of the example devices mentioned above and described further below in accordance with present principles. The first of the example devices included in the system 10 is a consumer electronics (CE) device 12. The CE device 12 may be a computerized Internet enabled ("smart") phone, a tablet computer, a laptop/notebook computer, a desktop computer, a head-mounted device (HMD) and/or headset such as smart glasses or AR or VR headset, another wearable computerized device, etc. Regardless, it is to be understood that the CE device 12 is configured to undertake present principles (e.g., communicate with other CE devices and servers to undertake present principles, execute the logic described herein, and perform other functions and/or operations described herein).

Accordingly, to undertake such principles the CE device 12 can be established by some, or all, of the components shown. For example, the CE device 12 can include one or more touch-enabled displays 14 that may be implemented by a high definition or ultra-high definition "4K" or higher flat screens. The touch-enabled display(s) 14 may include, for example, a capacitive or resistive touch sensing layer with a grid of electrodes for touch sensing consistent with present principles (e.g., to provide input to the GUIs discussed below).

The CE device 12 may also include an analog audio output port 15 to drive one or more external speakers or headphones, and may include one or more internal speakers 16 for outputting audio in accordance with present principles, and at least one additional input device 18 such as an audio receiver/microphone, e.g., for conversing telephonically or for entering audible commands to the CE device 12 to control the CE device 12. The example CE device 12 may also include one or more wired or wireless network interfaces 20 for communication over at least one network 22 such as the Internet, a WAN, a LAN, etc. under control of one or more processors of a processor system 24, such as a CPU or other processor mentioned above. Thus, the interface 20 may be, without limitation, a Wi-Fi transceiver and/or wireless telephony transceiver for communicating over a wireless cellular network (e.g., operated by Verizon, T-Mobile, or AT&T), both of which are examples of a wireless computer network interface.

It is to be understood that the processor system 24 may include one or more processors acting independently or in concert with each other to execute an algorithm (e.g., the algorithms referenced herein), whether those processors are in one device or more than one device. Thus, in some specific examples, the processor system may include a single processor, while in other examples the processor system may include more than one processor. The processor system 24 controls the CE device 12 to undertake present principles, including the other elements of the CE device 12 described herein such as controlling the display 14 to present images thereon and receiving input therefrom. Furthermore, also note the network interface 20 may be a wired or wireless modem or router or other suitable network interface.

In addition to the foregoing, the CE device 12 may also include one or more input and/or output ports 26 such as a high-definition multimedia interface (HDMI) port or a universal serial bus (USB) port to physically connect to another CE device, and/or a headphone port to connect headphones to the CE device 12 for presentation of audio from the CE device 12 to a user through the headphones. For example, the input port 26 may be connected wired or wirelessly to a cable or satellite source 26a of audio video content. Thus, the source 26a may be a separate or integrated set top box, or a satellite receiver. Or the source 26a may be a game console or disk player containing content.

The CE device 12 may further include one or more non-transitory computer memories/computer-readable storage media 28 such as disk-based or solid-state storage that are not transitory signals, in some cases embodied in the chassis/housing of the CE device 12 (e.g., as standalone devices) or as removable memory media or the below-described server(s). Also, in some embodiments, the CE device 12 can include a position or location receiver such as but not limited to a cell phone transceiver, global positioning system (GPS) transceiver, and/or altimeter 30. This transceiver may therefore be configured to receive geographic position information from a satellite or cellphone base station (and/or determine an altitude at which the CE device 12 is disposed) and then provide the information to the processor system 24. However, it is to be understood that another suitable position receiver other than a GPS receiver, cell phone transceiver, and/or altimeter may be used consistent with present principles to determine the location of the CE device 12. In some examples, the GPS transceiver 30 may be located on a streetlight or other infrastructure for which location is to be reported for purposes described in greater detail below.

Continuing the description of the CE device 12, in some embodiments the CE device 12 may include one or more cameras 32 that may be thermal imaging cameras, digital cameras such as webcams, infrared (IR) sensors, and/or other types of cameras or other optical sensors integrated into the CE device 12 and controllable by the processor system 24 to gather pictures/images and/or video consistent with present principles. Also included on the CE device 12 may be a Bluetooth® transceiver 34 and/or other Near Field Communication (NFC) element 36 for communication with other devices using respective Bluetooth and/or NFC wireless technologies/communication standards. An example NFC element can be a radio frequency identification (RFID) element.

Further still, the CE device 12 may include one or more auxiliary sensors 38 that provide input to the processor system 24. For example, one or more of the auxiliary sensors 38 may include one or more pressure sensors forming a layer of the touch-enabled display 14 itself and may be, without limitation, piezoelectric pressure sensors, capacitive pressure sensors, piezoresistive strain gauges, optical pressure sensors, electromagnetic pressure sensors, etc.

Other sensor examples include a motion sensor such as an accelerometer, gyroscope, magnetometer, a speed and/or cadence sensor, an event-based sensor, a gesture sensor (e.g., for sensing gesture command), etc. In one specific example, the sensor 38 thus may be implemented as an inertial measurement unit (IMU) with motion sensors including individual accelerometers, gyroscopes, and magnetometers, and/or other components of that include a combination of accelerometers, gyroscopes, and magnetometers, to determine the location and orientation of the CE device 12 in three dimensions. A gyroscope consistent with present principles may sense and/or measure the orientation of the CE device 12 and provide related input to the processor system 24, an accelerometer consistent with present principles may sense acceleration and/or movement of the CE device 12 and provide related input to the processor system 24, and a magnetometer consistent with present principles may sense and/or measure directional movement of the CE device 12 and provide related input to the processor 122.

The CE device 12 may also include an over-the-air TV broadcast port 40 for receiving OTA TV broadcasts and providing the input to the processor system 24. In addition to the foregoing, it is noted that the CE device 12 may also include an IR transceiver 42 such as an IR data association (IRDA) device. A battery (not shown) may be provided for powering the CE device 12, as may a kinetic energy harvester that may turn kinetic energy into power to charge the battery and/or power the CE device 12. A graphics processing unit (GPU) 44 and field programmable gated array 46 also may be included.

One or more haptics/vibration generators 47 may also be provided for generating tactile signals/vibrations that can be sensed by a person holding or in contact with the device. The haptics generators 47 may thus vibrate all or part of the CE device 12 using an electric motor connected to an off-center and/or off-balanced weight via the motor's rotatable shaft so that the shaft may rotate under control of the motor (which in turn may be controlled by a processor such as the processor system 24) to create vibration of various frequencies and/or amplitudes as well as force simulations in various directions.

In addition to the CE device 12, the system 10 may include one or more other CE devices/types, which may include some or all of the components mentioned above in relation to the CE device 12. In one example, a second CE device 48 may be established by an Internet of things (IoT) device, a smartphone, a laptop computer, etc. A third CE device 50 is also shown in FIG. 1 and may include similar components as the other CE devices. Thus, in one example, the CE device 50 may be configured as a head-mounted display (HMD) that may include a heads-up transparent or non-transparent display for respectively presenting extended reality (XR) content such as AR content, VR, content, and/or mixed reality (MR) content. The XR content itself might include, as an example, one or more of the GUIs described below, presented stereoscopically. The HMD may be configured as a glasses-type display, or as goggle-type and/or VR-type display vended by various computer hardware manufacturers such as Apple, Oculus, Meta, etc. Or the CE device 50 may be established by a smart streetlight consistent with present principles and, as such, the smart streetlight may include a network communication interface (e.g., Wi-Fi transceiver and/or cellular data transceiver) for communicating with other devices to implement present principles.

In the example shown, only three CE devices are shown, it being understood that fewer or more devices may be used. A device herein may implement some or all of the components shown for the CE device 12. Any of the components shown in the following figures may incorporate some or all of the components shown in the case of the CE device 12.

Now in reference to the afore-mentioned at least one server 52, it includes at least one server processor 54 and at least one tangible computer readable storage medium 56 such as disk-based or solid-state storage. The server 52 also includes at least one network interface 58 that, under control of the server processor 54, allows for communication with other illustrated devices over the network 22 (e.g., the Internet), and indeed may facilitate communication between the server 52 and any other servers/client devices as described herein. Note that the network interface 58 may be, e.g., a wired or wireless modem or router, Wi-Fi or Ethernet transceiver, or other appropriate interface such as, e.g., a wireless telephony transceiver.

Accordingly, in some embodiments the server 52 may be an Internet server or an entire server "farm" of multiple services. If desired, the server 52 may include/perform "cloud" functions such that the devices of the system 10 may access a "cloud" environment via the server 52 in certain example embodiments. Additionally or alternatively, the server 52 may be implemented by one or more computers in the same room as the other devices shown, or nearby.

The components shown in the following figures may include some or all components shown herein. Any user interfaces (UI) described herein may be consolidated and/or expanded, and UI elements may be mixed and matched between UIs. UIs may be presented at a client device like the CE device 12 under control of the client device itself and/or under control of the server 52 as remotely controlling the CE device 12 to present the UIs thereon.

With the foregoing in mind, it is to be understood that present principles deal in part with the creation of training data for machine-based artificial intelligence (AI) models. The training data may relate to geographic setpoints and other types of setpoints for use within the machine learning models and methods. Accordingly, present principles recognize that lighting, particularly outdoor municipal and/or utility-owned street lighting, serves as an example to illustrate geographic setpoints, with it being further noted that present principles may be applied to other technical fields as well. In terms of outdoor municipal and/or utility-owned street lighting, their unique characteristics help illustrate the advantages of the present technology. However, as mentioned above, the same technological principles may be applied across other industries and applications as well, including for density (e.g., housing density).

Thus, present principles deal with creating training data through technological means for machine learning models, improving the configuration and processing ability of the computer-based models themselves. Present principles may encompass both supervised and unsupervised learning methods as well as other types of learning methods.

Describing the technological advantages of setpoints consistent with present principles, setpoints may provide a user-friendly approach to control systems in that once a person defines a desired outcome, the electronic system may autonomously adjust its performance to achieve/reach the setpoint. This helps eliminate the need for constant user intervention. But beyond this aspect, setpoints have another advantage in that they can adapt to and compensate for unforeseen variables due to outside factors. Thus, setpoints may by their nature account for external variables even if those factors are not explicitly programmed into the setpoint/system itself.

With the forgoing in mind, reference is now made to FIG. 2. This figure demonstrates a geographic setpoint 200 for a streetlight and geographic substantive performance 210 consistent with present principles. The setpoint 200 may establish a target lighting layer (TLL) indicating desired light parameters for a given streetlight, and may be specified by a human user of the ML-based system. Accordingly, the setpoint 200 indicates desired lighting along a city street 240. As may be appreciated from the illustration of the setpoint 200 in FIG. 2, areas 250 of the street 240 may be programmed to have a first amount of uniform illumination from one or more streetlights, while areas 260 of sidewalks next to the street 240 may be programmed to have a second, lesser amount of uniform illumination.

Accordingly, it is to be understood that geographic setpoints like the setpoint 200 are, according to present principles, related to control theory in that they may set the desired or target value for a fundamental variable, or process value (PV) of a control system, which may differ from the actual measured value of the variable as represented by the geographic substantive performance 210. Setpoints may also be called "desired setpoints" or "desired performance" in non-limiting examples. With a setpoint, a user can therefore set a goal (or target), and the electronic system can then work to meet that goal or target and subsequently maintain it. So in the context of FIG. 2, this figure demonstrates a geographic setpoint for adjustments based upon geography (street geography). The geographic setpoints differ from other setpoints still encompassed by present principles because the geographic setpoints may vary by specific geography of a given street. Geography of the street 240 may include not only X-Y dimensions of various aspects of the street 240, but also elevation and elevation changes of the street 240.

Turning to geographic substantive performance 210, this aspect of FIG. 2 demonstrates actual, real-world lighting of the street 240 from the relevant streetlight. Accordingly, the geographic substantive performance 210 visually demonstrates the way the actual streetlight performs. In the present example, the substantive performance 210 is the amount of horizontal illumination which is placed on the ground around the streetlight due to light output from the luminaire of the streetlight. However, vertical illumination and other types of illumination are also encompassed by present principles.

As may be appreciated from the illustration of geographic substantive performance illustrated in FIG. 2, illumination is greatest at an area 270 beneath the streetlight. Area 272 (surrounding area 270) has illumination levels less than the area 270 but greater than the illumination levels of a surrounding area 274. Area 276 has illumination levels less than the area 274, but still greater than the illumination level of areas at even greater distances from the streetlight itself. Note that illumination may be measured and expressed in lux per this example.

The illustration of geographic absolute difference 220 per FIG. 2 demonstrates that an electronic system consistent with present principles may directly compare actual performance (substantive performance 210) with the target (geographic setpoint 200) using raster math. This allows the system to ultimately identify the most optimal performance metrics for the streetlight itself to meet the geographic setpoint 200, whether those metrics relate to streetlight hardware that may be installed and/or streetlight software configurations for the streetlight hardware as remotely-controlled over a network.

Accordingly, it is to be understood that raster math can be used by the electronic system to calculate the Geographic Absolute Difference (GAD) 220, which may be understood as the gap or difference between the desired light level per geographic setpoint 200 and the actual light level on the ground per the substantive performance 210. Consistent with present principles, the smaller the GAD, the better the performance of the light in conformance with the setpoint 200.

Accordingly, the system may evaluate different streetlight hardware (e.g., like various outdoor light fixture types as will be described shortly) as well as different light software options to minimize the GAD and identify the most efficient hardware/software solution based on the location of the streetlight itself and the desired setpoint 200.

Once the system has these optimized results, the results may be used as part of a training dataset for supervised and/or unsupervised learning in an artificial intelligence-based machine learning model. Also note that in addition to or in lieu of supervised and unsupervised learning, other types of machine learning may also be used consistent with present principles, including reinforcement learning and semi-supervised learning.

Accordingly, the description below will detail the creation of such training data for machine learning models to be used consistent with present principles, as applicable to supervised, unsupervised and even semi-supervised learning paradigms, among others. For example, supervised learning may be applied to the lighting example from above. Here, the model may be trained using input data about objects (like buildings or streets) and the desired lighting level (geographic setpoint) for those locations, along with ground truth labels of respective hardware/software configurations. The model may then learn to predict an optimal lighting configuration for a given streetlight, aiming to minimize the gap between the actual light output and the desired setpoint as previously discussed in reference to FIG. 2.

Figure 3:
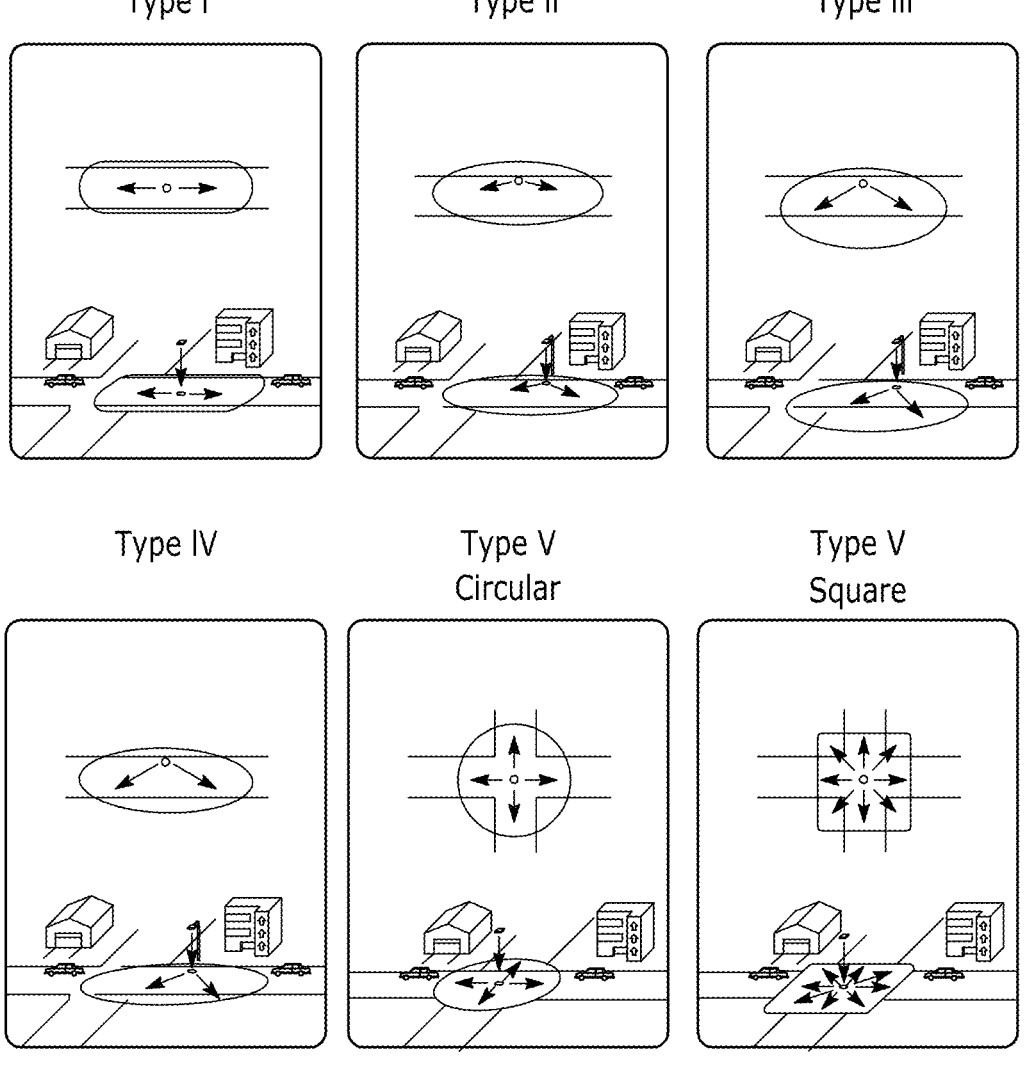
FIG. 3 illustrates different types of streetlights that may be used consistent with present principles.

However, before describing such training data in more detail, different types of streetlight configurations will be described for greater context. Accordingly, reference is made to FIG. 3, which shows different types of streetlight hardware configurations (luminaires). As shown, a Type I configuration may use a pattern type of two-way fifteen degree lateral distribution, and its applications may be for lighting sidewalks, paths, and walkways. The X-Y fixture placement may be in the center of the walkway (with the light being above the walkway in the Z dimension) as shown in FIG. 3, and an optimal mounting height may be equal to the width of the associated walkway itself.

A type II configuration may use a pattern type of twenty five degree lateral distribution, and its applications may be for lighting narrow roadways, wide walkways, ramps, and entrance roadways. The X-Y fixture placement may be at or near the side of the street or other lighting area as shown in FIG. 3, and an optimal mounting height may be one where the width of the road does not surpass 1.75 times the mounting height.

A type III configuration may use a pattern type of forty degree lateral distribution, and its applications may be for lighting "conventional" roadways and parking areas. The X-Y fixture placement may be at the side of the street or other lighting area as shown in FIG. 3, and an optimal mounting height may be one where the width of the road does not surpass 2.75 times the mounting height.

A type IV configuration may use a pattern type of sixty degree semicircular distribution, and its applications may be for lighting wide roadways as well as sides of walls or buildings. The X-Y fixture placement may be at the side of the street or other lighting area as shown in FIG. 3, and an optimal mounting height may be one where the width of the road does not surpass 3.7 times the mounting height.

A type V circular configuration may use a pattern type of three hundred sixty degree circular distribution, and its applications may be for lighting roadways, center parkway islands, intersections, and large parking areas. The X-Y fixture placement may be at or near the center of the relevant area as shown in FIG. 3, and an optimal mounting height may be one for equal light distribution at all angles.

A type V square configuration may use a pattern type of three hundred sixty degree square distribution, and its applications may be for lighting roadways, center parkway islands, intersections, and large parking areas. The X-Y fixture placement may be at or near the center of the relevant area as shown in FIG. 3, and an optimal mounting height may be one for equal light distribution at all angles for use where the light pattern is to have a more defined edge compared to the type V circular configuration.

Also to aid the reader's understanding, note that light intensity is one example of lighting performance data that may be used consistent with present principles. Light intensity, sometimes referred to as light power or light dimming as well, relates to light level as measured in LUX or footcandles for horizontal/vertical illuminance/luminance (e.g., in photometrics). Thus, a system consistent with present principles may evaluate geographic substantive performance options from low to high light intensity to identify which one matches the Target Lighting Layer (geographic setpoint) the best. Also note that when two or more luminaires contribute to light, their intensity/power may be summed.

But another example of lighting performance data consistent with present principles is light color. Recognizing that light from a given luminaire can have many different colors (and may even change over time based on remote control of the luminaire), the color of light may be expressed as either Correlated Color Temperature (CCT) or Spectral Power Distribution (SPD). It may be expressed in other metrics as well. Also note that when two or more luminaires contribute to light, their color values may be averaged.

Still another example of lighting performance data consistent with present principles is light distribution/beam-spread. Distribution may thus refer to the way light leaves the luminaire and is placed on/intersects the ground. Different luminaires may have specific distributions, but many of them can be grouped into one of the types described above in reference to FIG. 3.

Accordingly, it is to be understood that although certain examples set forth herein use horizontal illuminance, other light characteristics may also be used in addition to or in lieu of that, including light color and distribution (as well as other types of illuminance, including vertical illuminance for example).

Referring now to FIG. 4, this figure shows example logic consistent with present principles that may be executed by a device such as the system 10, CE device 12, and/or server 52 alone or in any appropriate combination. More generally, the logic of FIG. 4 may be executed by a processor system that includes one or more processors as embodied in a single device or more than one device. Also note that while the logic of FIG. 4 is shown in flow chart format, other suitable logic may also be used.

Beginning at block 400, the device may identify a three-dimensional (3D) location of a streetlight. For example, the device may identify the 3D location from electronic local storage (e.g., one that stores a city lighting plan containing this data), from an electronic map or other online data, and/or based on user input specifying the 3D location. Digital elevational models and digital surface models may also be used (e.g., to determine a base height of the streetlight where it enters the ground). From block 400 the logic may then proceed to block 405.

At block 405 the device may identify an orientation of the streetlight. The device may do so by accessing electronic storage at which the orientation data is stored (e.g., one that stores a city lighting plan containing this data) and/or access it via receipt of user input specifying the orientation of the streetlight. As a specific example, the orientation may be identified from an image chip and/or tabular data, whether provided by the user or preloaded into the system.

From block 405 the logic may then proceed to block 410. At block 410 the device may identify a height of the streetlight (luminaire on the streetlight mast) relative to ground. Here too this may be accessed via electronic storage at which the height data is stored (e.g., one that stores a city lighting plan containing this data) and/or access it via receipt of user input specifying the orientation of the streetlight.

After block 410 the logic may proceed to block 415. At block 415 the device may access lighting performance data for the streetlight. The lighting performance data may be stored in and accessed via a photometric file format, such an IES file, TM-33 file, or other TM file type. And again note that the lighting performance data itself may pertain to light intensity for the for the streetlight, light color for the streetlight, and/or light distribution for the streetlight.

Then at block 420, the device may identify substantive illumination for the streetlight at least at first and second areas on the ground beneath the light based on the lighting performance data, the 3D location, the orientation, and the height. For example, the inverse square law may be used to identify the substantive illumination using the lighting data in the photometric file (e.g., data for a particular type of streetlight like one of types I-V square above as provided by the light's manufacturer), as well as the 3D location, height, and orientation data for the streetlight. Here, the inverse square law relates to measured light intensity being inversely proportional to the distance squared ($d^2$) from the light source itself (intensity=$1/d^2$).

From block 420 the logic may then proceed to block 425. At block 425 the device may perform interpolation to identify substantive illumination for the streetlight at least at third and fourth areas on the ground, with the first, second, third, and fourth areas being different from each other. This step, along with step 420, may be done using EvariLUX software as will be described in greater detail below.

But still in reference to FIG. 4, note that the logic may proceed from block 425 to block 430. At block 430 the device may identify substantive performance data for the streetlight. In one particular example, the device may use the substantive illumination of the first, second, third, and fourth areas to generate a substantive performance layer (SPL), which in one implementation might be the geographic substantive performance 210 described above. Also note that in one example embodiment, the SPL may pertain to horizontal illumination and/or vertical illumination.

From block 430 the logic may then proceed to block 435. At block 435 the device may access setpoint data that is associated with the streetlight. Therefore, in one particular example the device may access a target lighting layer (TLL) associated with the streetlight (e.g., the geographic setpoint 200). The TLL itself may indicate target illumination for the first, second, third, and fourth areas (as well as other areas receiving light from the streetlight). Additionally, note that in one example the SPL may establish a first image and the TLL may establish a second image, with the first and second images then being used for raster calculations as will be described later. But also note that in addition or in the alternative, the SPL may establish a first pixel value and the TLL may establish a second pixel value, with the first and second pixel values then used for the aforementioned raster calculations rather than the images themselves. For example, the pixel values may be stored in a data table accessible to the system.

The logic of FIG. 4 may then proceed to block 440 where the device may compare the substantive performance data to the setpoint data to determine a difference between the substantive setpoint data and the setpoint data. Thus, in one particular example the device may compare the substantive illumination for the first, second, third, and fourth areas (and others) to the target illumination for the first, second, third, and fourth areas (and others) to determine an absolute illumination difference between the substantive illumination and the target illumination for each of the first, second, third, and fourth areas (and others) using the raster calculations. Again, such raster calculations will be described in greater detail later.

After block 440 the logic may proceed to block 445. At block 445 the device may correlate the difference to a particular configuration for the device. Thus, in one specific example, the device may correlate the absolute illumination differences to a particular lighting configuration for the streetlight, where the particular lighting configuration for the streetlight may relate to one or both of a particular luminaire to use for the streetlight (e.g., type I-Vsquare) and/or a particular software configuration to use for the luminaire of the streetlight (e.g., controllable light color).

From block 445 the logic may then move to block 450. At block 450 the device may store together, in electronic storage, the substantive performance data (e.g., SPL), the setpoint data (e.g., TLL), and the particular configuration for the streetlight (e.g., particular hardware and/or software lighting configuration). Together, these stored data pairs may establish a training dataset for training a model consistent with present principles.

From block 450 the logic may then proceed to block 455. At block 455 the device may train a model using the SPL, TLL, and the absolute difference for each of the first, second, third, and fourth areas (and others beneath the streetlight). Again note that supervised learning, unsupervised learning, reinforcement learning, and/or deep learning may be used to do so.

In terms of supervised training in particular, and indeed for the labeled training data itself as stored at block 450 itself, the labeled training data may include the SPL and TLL as inputs, while a given particular hardware and/or software lighting configuration may establish a ground truth label for a respective SPL/TLL pair in the dataset.

Also note that the model that is trained may be one configured for pattern recognition. As such, the model may be established by one or more ore artificial/deep neural networks like a recurrent neural network and/or convolutional neural network. However, other types of models may also be used consistent with present principles, including statistical pattern recognition models, fuzzy algorithm models, structural algorithm models, template matching algorithm models, and others.

From block 455 the logic may then proceed to block 460. At block 460 the trained model may be deployed so that optimal hardware and/or software lighting configurations for different streetlights in a particular municipality (or other local jurisdiction) may be dynamically and quickly inferred en masse and on the fly. This may be done using present principles to minimize device power consumption and processor bandwidth usage, with the technical improvements being realized in the generated training data itself that helps achieve these improvements as well as the resulting model as trained using that unique training dataset.

From block 460 the logic may then proceed to block 465. At block 465 the device may present a graphical user interface (GUI) on a display based on the model's inference of the particular hardware and/or software configurations for each streetlight. The GUI may therefore visually indicate the particular hardware configuration and/or the particular software configuration for each streetlight. The GUI may be presented as part software to control the model in some specific examples, with that software also being executable to indicate a desired TLL during deployment.

Figures 5, 6:
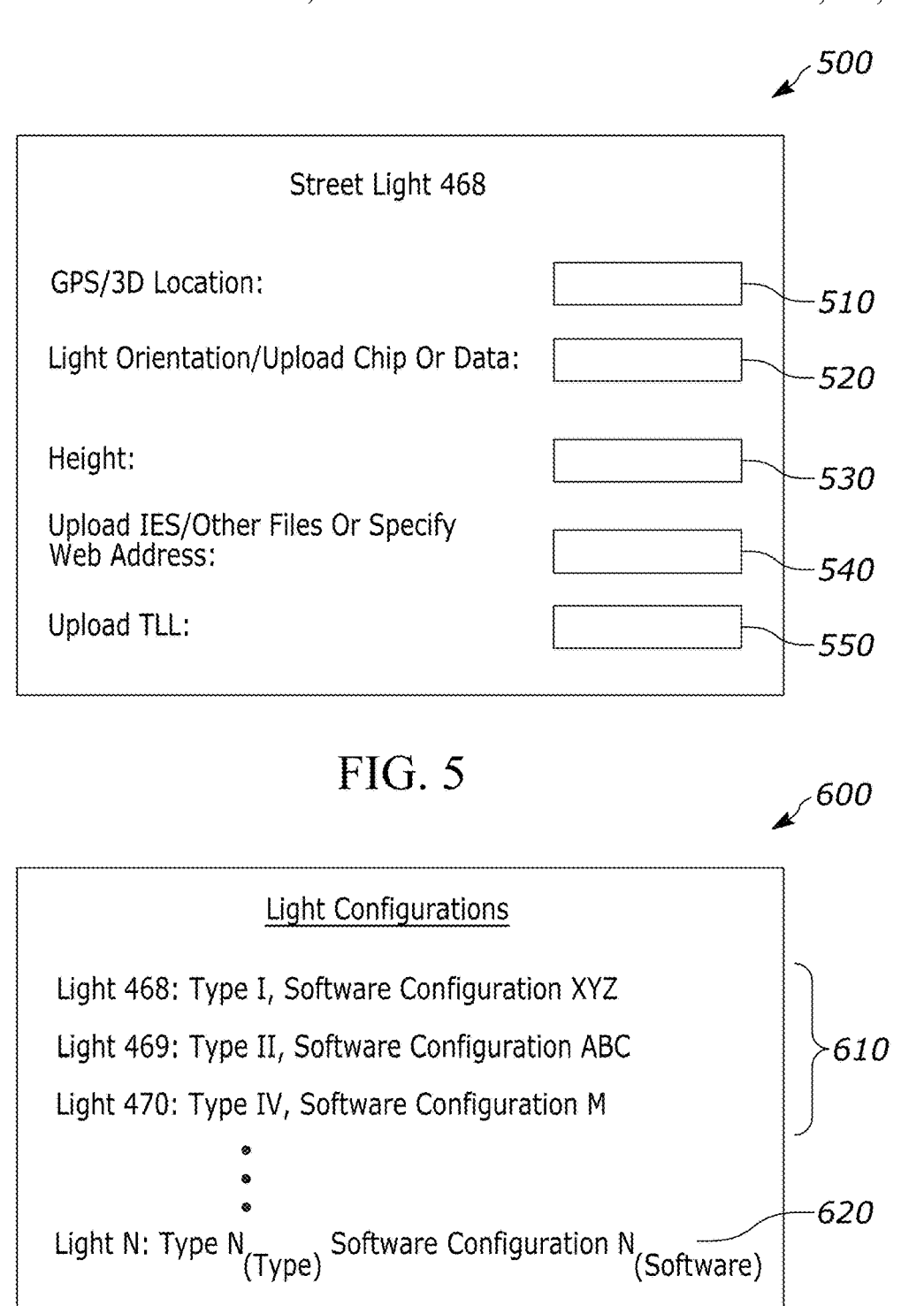
FIG. 5 shows an interactive graphical user interface (GUI) that may be presented for a user to provide various inputs to the system consistent with present principles.
FIG. 6 shows an interactive GUI presenting outputs inferred by a machine learning-based model that has been trained consistent with present principles.

Accordingly, FIG. 5 shows an example GUI 500 for an end-user to indicate a desired TLL and other data from which an inference may be made during deployment, while FIG. 6 shows an example GUI 600 that indicates various hardware and software configurations for different street-lights of a given municipality as inferred by the model during the deployment of the model.

Beginning first with the GUI 500 of FIG. 5, initially note that this GUI 500 may be used not just during deployment to specify streetlight data, but also as a GUI through which various aspects of a streetlight may be specified for generating training data related to the streetlight consistent with other aspects of FIG. 4. Further note that while the GUI 500 is an example through which an end-user may enter certain data, some or all of this data may also be acquired from or accessed via a third party data provider.

In any case, as shown in FIG. 5, the GUI 500 may include a data input field 510 into which GPS coordinates and/or other 3D location data for the relevant streetlight may be entered (e.g., using voice input, a hard or soft keyboard, etc.). The GUI 500 may also include a data input field 520 into which light orientation data may be entered, and/or through which an image chip or tabular data indicating the light's orientation may be uploaded. The GUI 500 may further include a data input field 530 at which a height of the light above the ground (as directly beneath the light) may be entered.

Additionally, an upload box 540 may be included on the GUI 500 for the end-user to upload an IES file, TM file, or other photometric file type indicating hardware aspects (and even different available software configurations) for the relevant light. Additionally or alternatively, the end-user may enter a website address (e.g., uniform resource locator (URL)) for where the device itself might access the relevant photometric file. For example, a URL may be provided to an online website where the streetlight's manufacturer has published the relevant photometric file or other data for the streetlight's luminaire itself.

FIG. 5 also shows that the GUI 500 may include an upload box 550 at which a TLL or other desired setpoint file/data may be entered. In some examples, the TLL may be configured using another interactive GUI also provided as part of the same software (e.g., application stored at the user's client device).

Now in reference to FIG. 6, the aforementioned GUI 600 is shown. Note that different streetlights are listed as example outputs 610, 620 from the trained model of FIG. 4. Each output 610 specifies a particular streetlight on which the model has been run, along with respective hardware and/or software configurations that, when implemented for the respective streetlight, result in actual lighting that most-optimally matches the desired setpoint/TLL for that respective streetlight from amongst all the available/analyzed hardware and software combinations for that streetlight. Output 620 indicates that this type of data may be output for "N" streetlights, which might be hundreds or even thousands of streetlights for a given municipality.

FIG. 6 also shows that the GUI 600 may include a selector 630. The selector may be selectable via touch input, cursor input, etc. to command the device to email or otherwise transmit notifications to predetermined recipients/client devices that indicate the outputs 610, 620. For example, selection of the selector 630 may command the device to send an email to a streetlight installing company or other party responsible for installation and management of street-lights in a given municipality so that this entity may install luminaires and configure software for each light from the output in accordance with the respective model output (inference) for each streetlight.

FIG. 6 also shows that the GUI 600 may include a selector 640. The selector 640 may be selectable to command the device to present another GUI through which the software of one or more lights indicated in the outputs 610, 620 may be remotely configured. Thus, software for operating a given streetlight may be adjusted to change/configure light color, light intensity, and even light beamspread.

Figure 7:
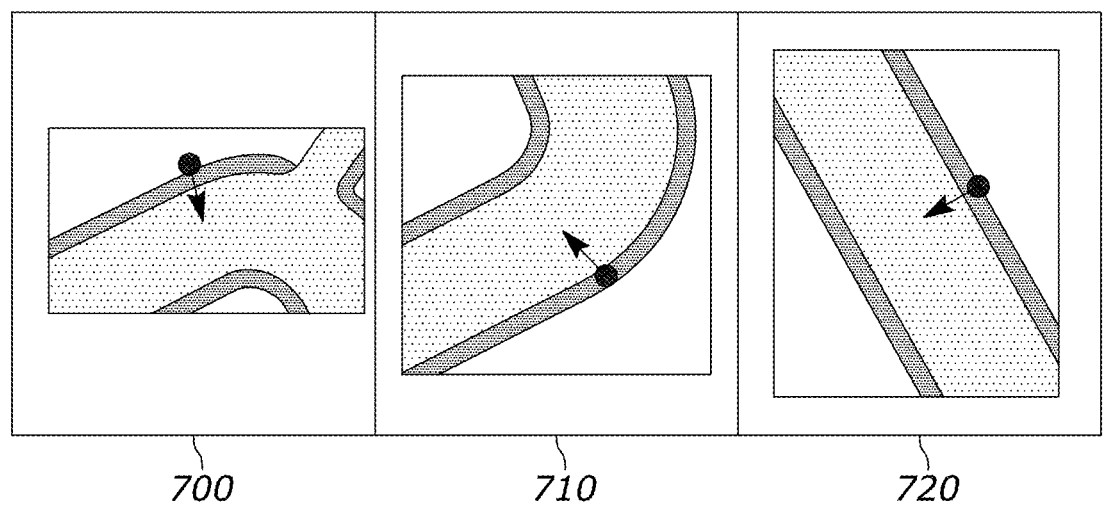
FIG. 7 is a schematic diagram illustrating different street-light orientations consistent with present principles.

Turning now to FIG. 7, this figure shows example street-light orientations relative to a street consistent with present principles. As shown in each box 700-720, the streetlight is oriented inward toward the center of the street from an outer edge of the street at which the vertical post for the streetlight itself might be installed. It may be appreciated from FIG. 7 that different streetlights may be located at different types of locations along a road or street, such as along a curve or along a straightaway portion of the street.

Accordingly, in an unsupervised learning approach consistent with present principles, the model that is being trained may not receive labeled training data as otherwise set forth above. Instead, the model may be presented with the same inputs from the supervised learning training data process, including the orientation images of FIG. 7 for example, but without any labels attached. The images will therefore not include labels indicating what the right dim-ming level/hardware configuration/software configuration is for the given streetlight. Rather, the unsupervised model may group similar street images together using one or more clustering algorithms, association and/or dimensional reduc-tion. Once the model has classified/clustered these images (image chips per this example) into groups, lighting design workflows and/or the matching process described herein (e.g., per FIG. 4) may be used to determine the optimal hardware or software solutions for each group/cluster, based on their shared characteristics, and then the model may be trained using one or more unsupervised learning techniques using that data. Consistent with this, example lighting design workflows are disclosed in U.S. Pat. No. 9,894,736 to the same inventor as the instant case. The subject matter dis-closed in the specification of U.S. Pat. No. 9,894,736 is hereby incorporated by reference. Also consistent with this, a matching process as mentioned in this paragraph may be one where the device evaluates geographic substantive per-formance/SPL options from low to high light intensity to identify which one matches the setpoint/TLL for a given light the best.

Moving on from FIG. 7, examples of types of analyses consistent with present principles will now be described in greater detail. As one example, luminaires from a single manufacturer may be analyzed using a trained model con-sistent with present principles. Thus, by feeding the trained model/system with IES files specific to a particular manu-facturer's products, the model can compare their perfor-mance and identify which ones best match the target lighting levels/TLLs (geographic setpoints) for different lights/loca-tions.

As another example, similar luminaires from multiple manufacturers may be compared by the trained model. This might be done since municipalities or other entities might want to compare luminaires from various manufacturers that share similar distribution patterns (e.g., Types 1-5 and VSquare). This may be done by feeding the model/system with IES files representing these "classes" of luminaires.

As yet another example, "average" performance profiles may be created. Here, note that new IES files may be created that represent the average performance of a specific lighting class across different manufacturers. This example may be helpful for situations where detailed information about every individual luminaire is not as important for a given implementation for whatever reason specific to a given use case.

Artificial intelligence (AI)-based models may therefore be used to generate data that can be used to train a machine learning model. The trained model may then streamline the lighting design results across a region, providing technical improvements in terms of increased power savings and reduced overall processing.

Indeed, as mentioned above the trained model can assist in at least two ways. First, the model can recommend optimal luminaires (hardware) for a given streetlight assembly, the assembly itself including not just the luminaire but surrounding hardware including the vertical post mounting the streetlight to the ground and the lateral post extending the luminaire from the vertical post out over the street in a given orientation. Accordingly, given the specific characteristics of a location (e.g., geometry and setpoint values), the model is configured to suggest luminaires that are most likely to achieve the desired lighting performance.

Second, the model can recommend optimizing lighting performance (software configurations). Accordingly, considering the local hardware and remote software options available for a given luminaire/light, the model can recommend adjustments to optimize the lighting output of a chosen luminaire for a specific location (e.g., light intensity, color, and/or beamspread). Desired intensity, color, and beamspread may even change over time, and the model can therefore autonomously and remotely manage the streetlights to conform to setpoints that might themselves vary over time given the needs of a particular municipality.

Thus, by training the model on the data generated by the processes above, the model may leverage the understanding of geographic setpoints and substantial performance, allowing for faster and more optimized outputs. This is in contrast to, for example, a device artificially grouping lighting in order to design for "typical layouts" that might not be particularized enough for a given implementation.

In terms of file types for the photometric files discussed herein, note that IES files may be used in some specific examples. These files might be used by lighting designers (both indoor and outdoor) and may contain detailed information about a luminaire's light output. Specifically, they may describe the initial intensity (candela values) at the light source/luminaire itself and how the light distributes across horizontal and vertical angles. The IES or other files may have their data populated by the luminaire's manufacturer, where the manufacture may have identified the data from empirical testing.

However, as also mentioned above, IES files are not the only file type that may be used for accessing lighting performance data consistent with present principles. Other file formats, like TM-33 files and other TM files, may also be used. These alternative file types may therefore also provide complementary information that can be integrated into the computer-based processes described herein.

Now describing the EvariLUX engine/software that may be used at steps 420 and step 425 of the logic of FIG. 4, raster calculations will be described in greater detail before moving on to other aspects of the EvariLUX software. Also note that each of the examples below (local hardware configuration implementations, remote software configuration implementations, and/or both) may use similar logic.

In terms of raster calculations, it is to be understood initially that rasters consistent with present principles may be a type of digital file format used to store images and other spatial data. They may each establish a grid-like map, where each square on the grid holds a specific value. These squares may be referred to as pixels, and the values each one contains may represent information like temperature, height, or, for street lighting specifically, illumination on the ground.

Rasters consistent with present principles can also provide different level of detail. Some, like aerial photos, might use three bands (red, green, and blue color values) to create color images by combining the values in each band for each pixel. In a street lighting example, a single-band raster might be used to represent the amount of horizontal light on the ground, both as to the actual levels and the target levels set for different areas. However, rasters can hold other types of information for each pixel as well, including additional bands for vertical illumination and other aspects of light, such as the luminaire's color and light distribution.

Figure 8:
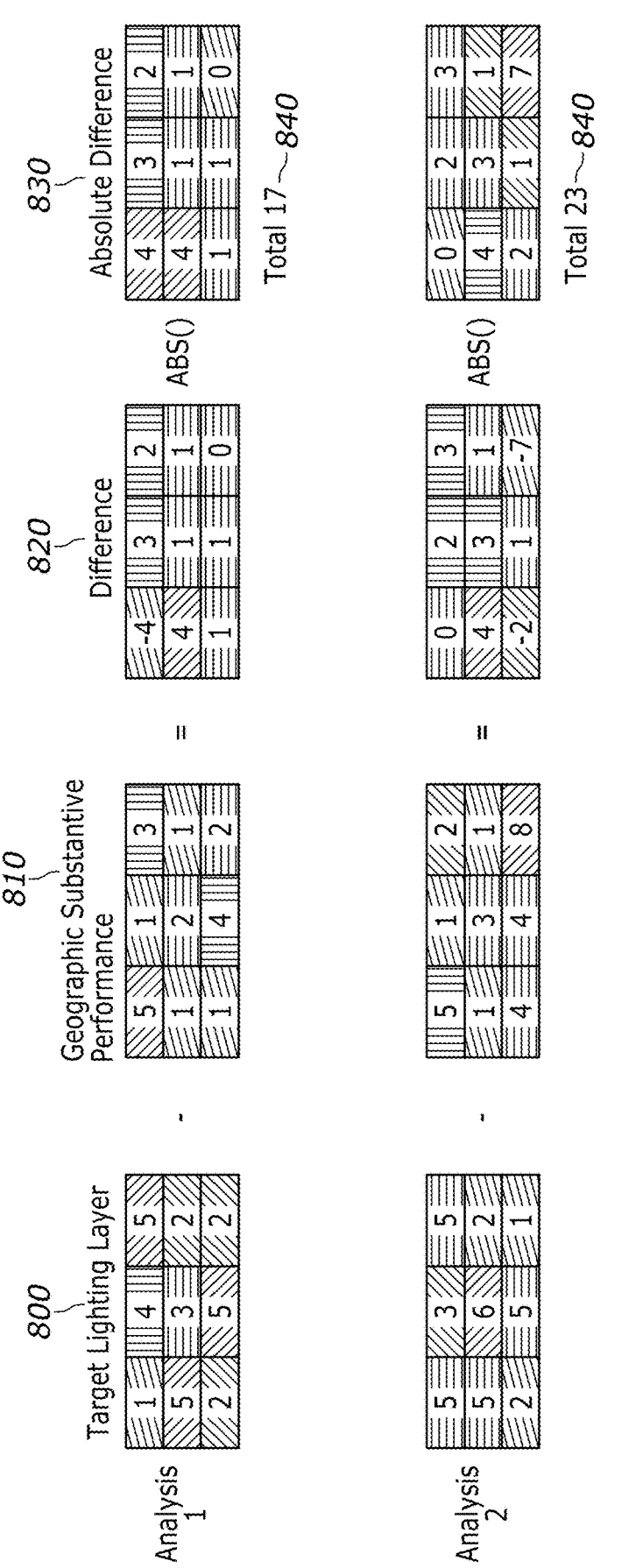
FIG. 8 is a schematic diagram illustrating raster calcula-tions that may be performed consistent with present prin-ciples.

Accordingly, present principles may use raster calculations as illustrated in FIG. 8. Two digital "map" types 800, 810 are shown. Type 800 are maps with values for the relevant target lighting levels (geographic setpoints). Type 810 are maps for the relevant actual light levels on the ground (illumination surface represented in an SPL as created by the EvariLUX software), also conceptually the "substantive performance". Raster calculations allow the system to perform calculations on these maps, like comparing respective values at each cell at a same position on the different rasters directly.

Accordingly, per the street lighting example, raster math may be used to determine the absolute difference between the target light levels 800 and the actual light levels 810, resulting in outputs 820. Thus, each cell in the outputs 820 indicates a relative difference between values in cells at the same raster position on the rasters 800 and 810. Each cell in the outputs 830 then indicates the absolute difference (rather than relative difference) between the value for the same respective cell in the TLL and the value for the same respective cell in the geographic substantive performance. This difference informs the system of how closely the actual lighting matches the desired outcome (TLL). Thus, the lower the absolute difference per cell and, more so, the lower the total score 840, the more optimally the actual lighting matches the desired outcome (setpoint) for the given hardware/software configuration under consideration.

More particularly, per the example of FIG. 8, the system may subtract the Geographic Substantive Performance from the Target Lighting Layer to identify the difference between the two of them. In order to find the best match, the system treats overlighting (negative numbers) and underlighting (positive numbers) the same. The system may then determine the absolute difference to reflect this. The total absolute difference across all cells show that Analysis 1 is a closer match than Analysis 2.

Further describing the EvariLUX software, this software may also be used to calculate how much light reaches the ground from different lighting sources/types to help create a given SPL/substantive performance output. It may do this by considering several factors, including location, direction, luminaire details, and ground elevation. In terms of location, EvariLUX may access the exact 3D location (X, Y, and Z coordinates) of the light source. In terms of direction, EvariLUX may access the direction (orientation) in which the light is pointing (e.g., via image chips with the orientation data). In terms of luminaire details, EvariLUX may analyze a file (e.g., IES file) that contains specific information about the light fixture itself, including how the light spreads out. In terms of ground elevation, EvariLUX may take into account the elevation of the ground, especially if the ground is uneven/not horizontal below the light. However, EvariLUX can also leverage flat elevations as well.

Figure 9:
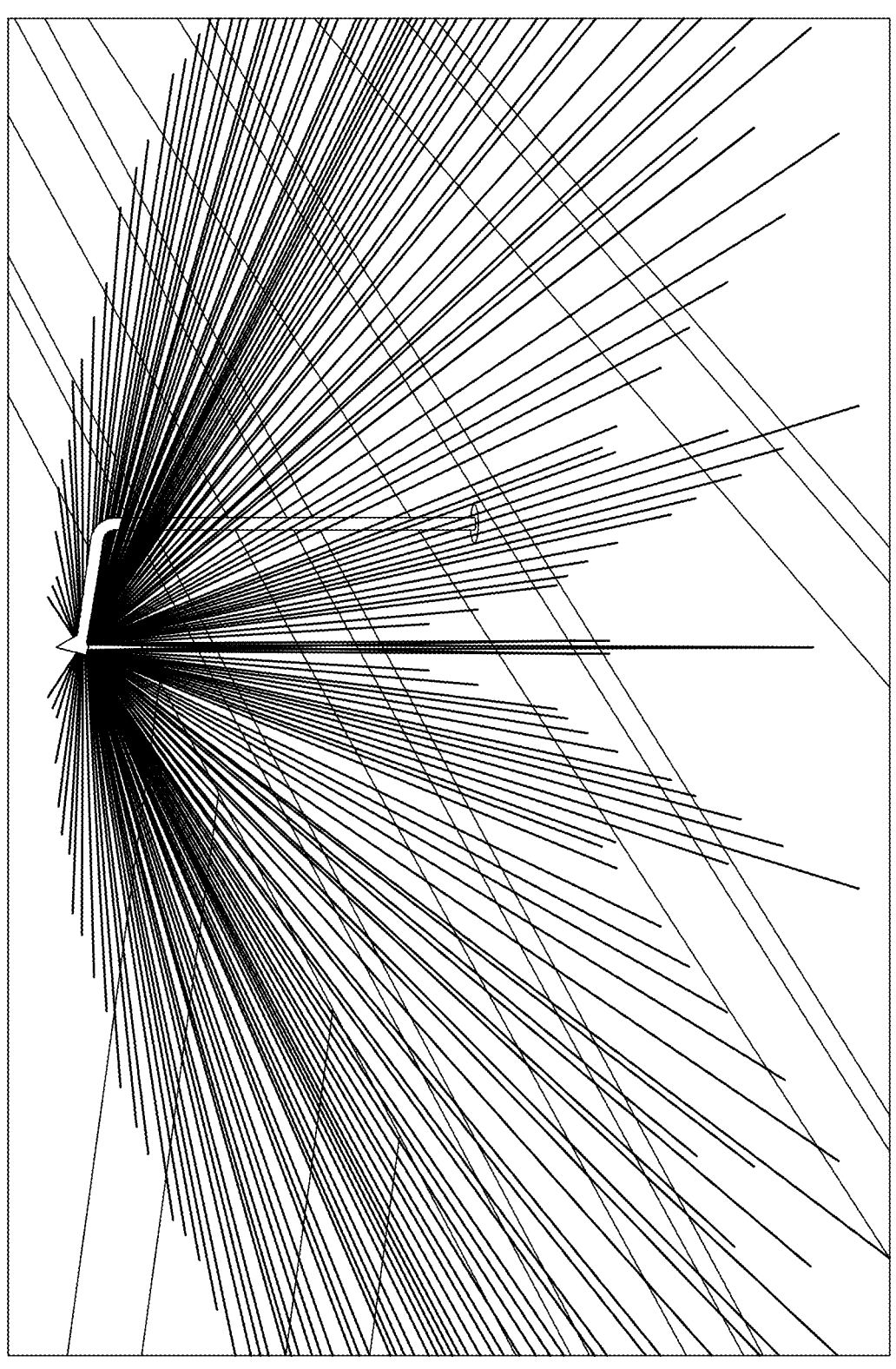
FIG. 9 is a schematic diagram illustrating light rays emanating from a streetlight as determined from an IES file or other photometric file consistent with present principles.

Using the information from the paragraph immediately above, EvariLUX may then perform calculations and technological processes to determine how much light would hit different locations on the ground. Thus, an example breakdown of the process will now be described. First in terms of light information, EvariLUX may start by reading the details about the light fixture from the IES file (or other photometric file), including the initial light intensity and how it spreads in different directions. In terms of light path, Evarilux may then extrapolate/imagine rays of light traveling from the fixture towards the ground, as illustrated in FIG. 9. In terms of impact point, EvariLUX may then calculate where each ray hits the ground and how long its light path is. In terms of the light level calculation, EvariLUX may use the inverse square law to determine the amount of illumination (light level) at each point (area) on the ground.

Then to create a comprehensive picture of the light levels on the ground, EvariLUX may fill in the data gaps between the calculated ground points, creating a seamless illumination surface where every cell/pixel has a value. This may be done using interpolation. Thus, using the islands of information about light levels obtained earlier in the process, EvariLUX may build data bridges between them using interpolation to create a smooth, continuous map as illustrated in FIG. 10.

Figure 10:
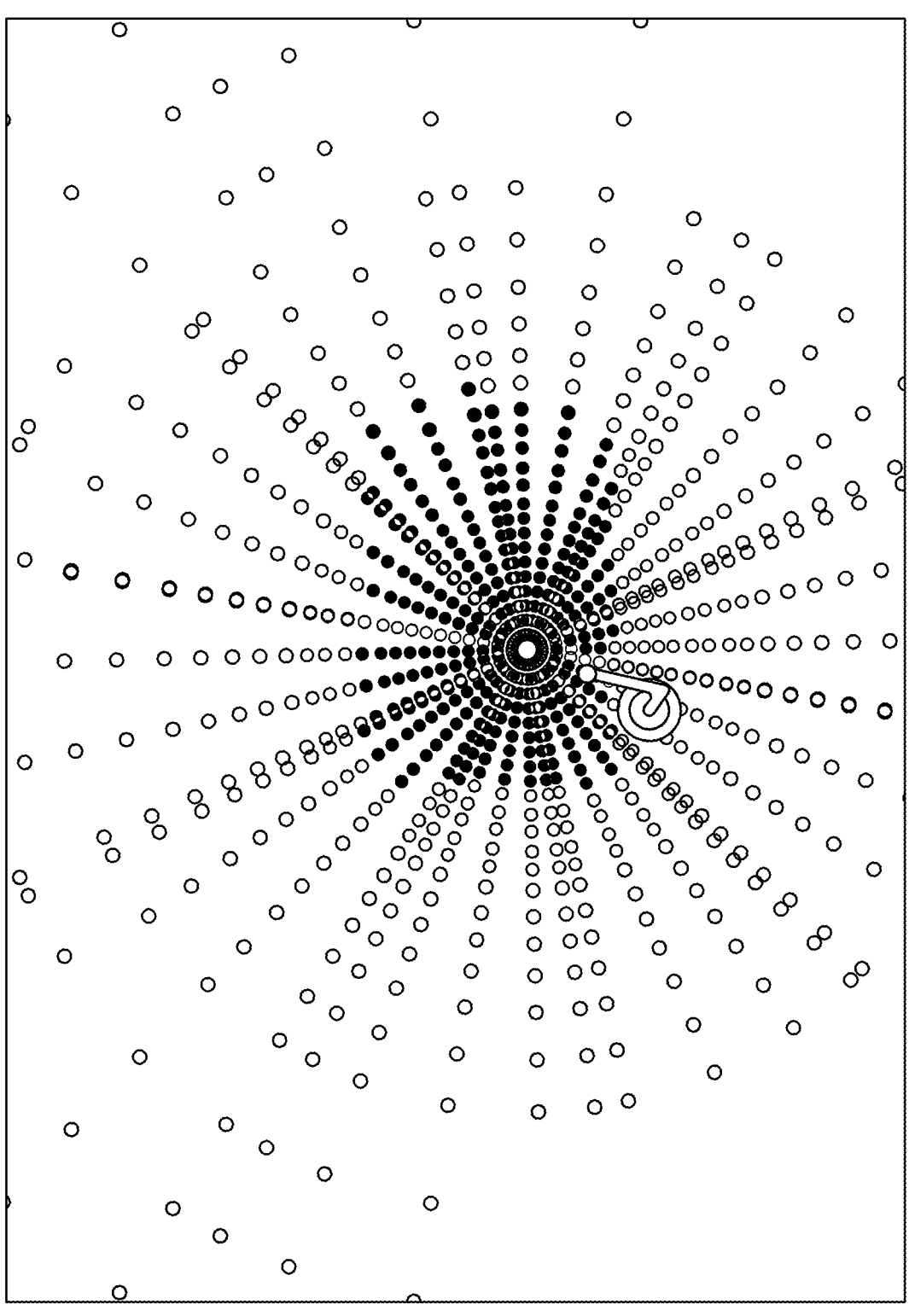
FIG. 10 shows a light map with light rays from an IES file along with interpolated light ray data consistent with present principles.

As shown in FIG. 10, the distinct points that are shown represent the extrapolated rays of light from the IES files, while other lighting is shown around those points according to the interpolation that is performed. FIG. 10 therefore shows a kind of map that results in a digital image called a "raster surface." Each tiny square (pixel) within the raster surface therefore represents the estimated illumination value for that specific spot on the ground.

Now describing in greater detail the matching of a TLL and substantive performance data for an illumination surface, initially some additional disclosure regarding TLLs will be provided before getting to the matching process itself.

In terms of TLL creation, this process defines where lighting is desired and what are the desired illumination levels for different areas around the streetlight, as specified by a municipality, end-user, etc. There may be different categories of streets used for a given TLL. For example, categories may include local street segments, collector street segments, major street segments, local/collector intersections, local/major intersections, collector/major intersections, crosswalks, bike lanes, sidewalks, private property, and/or combinations thereof. Each may have its own TLL.

While there are recommended practices for target lighting levels in many instances, there is often no suitable one-size-fits-all approach. Cities can therefore customize these plans based on specific needs using present principles. As one example, targeted safety measures may be a need, where crosswalks in areas with a high crash history might be desired to have brighter lighting compared to quieter streets. As another example, time-based adjustments may be a need, where the lighting levels may be adjusted at different specific times, such as increasing illumination on Halloween night between sunset and 10 μm to enhance pedestrian visibility.

With the foregoing in mind and now in terms of the matching referenced above, the system may compare the TLL (geographic setpoint) and illumination surface (substantive performance) in a cell-by-cell analysis, such as using raster calculations as set forth above. To reiterate, example illumination surface (substantive performance) and TLL (geographic setpoint) images are shown in FIG. 2.

Both the TLL and the illumination data (substantive performance) from each luminaire may thus be converted into raster images as set forth above. These images may thus establish grids where each square (cell) holds a value representing the desired or actual light level in that specific geographic location (as represented in the raster image). The system may then compare the values in each corresponding cell of the TLL and the illumination surface. This tells the system whether the luminaire is providing more, less, or the exact amount of light needed to meet the target level for that particular area. By analyzing these comparisons across the entire geographic grid, the system can identify areas where the luminaire might be over-illuminating, under-illuminating, or performing as desired according to the target lighting plan.

After comparing the TLL with each luminaire's illumination surface, the system can identify the optimal luminaire for a specific location by determining the least deviation, calculating the overall difference between the TLL and each luminaire raster. The luminaire with the smallest overall difference (least deviation) is considered the best match. This luminaire therefore provides illumination that most closely aligns with the desired lighting level (geographic setpoint) for that particular location, based on the IES files that are used.

FIG. 2 also shows the geographic absolute difference. While black and white drawings are being used for this filing, it is to be understood that actual images per FIG. 2 may use color coding to show how closely the actual light levels (illumination surface) match the target lighting layer (TLL)/geographic setpoint. Specifically, areas 250, 260 may be colored green to indicate deviations from the TLL, either too high or too low illumination. Eastern and western sections of the geographic absolute difference image 220—green color on the east and west sides of the road segment, designated by number 250 in FIG. 2—may signify that the actual light levels there are significantly different from the desired levels set in the TLL. Center of the road-a green patch 260 under the light fixture also indicates a deviation. Here, the illumination surface shows a value of around thirteen lux (blue), while the TLL specifies a target of seven lux. Although the difference is similar to the green areas on the sides, the specific color shade might differ to visually distinguish between over-illumination and under-illumination. The inverted U-shape—the upside-down U-shaped area 270 in the image represents locations where the actual light levels (illumination surface) closely match the TLL values, and may therefore be colored white. Private property-areas 280 designated as zero lux on private property show minimal illumination in the actual light level data. Since both the TLL and illumination surface aim for minimal light here, the difference between the two layers is small and might be represented by a similar color (potentially dark green or black).

Thus, to reiterate, these grid-like images established by the rasters may be made up of tiny squares (pixels) with color representing the data value at that location. To compare different rasters representing light levels, the system can calculate the total difference between their values. The raster with the smallest overall difference is considered the closest match to the target lighting plan.

With the foregoing in mind, note that two different methods for using Target Lighting Layer (TLL) data to streamline the design process for outdoor lighting may be used-image-based training, and geospatial analysis with extracted values. In terms of image-based training, the system can train a machine learning model using actual TLL images from specific locations. This model can then analyze new TLL images and recommend lighting solutions that closely match the desired lighting levels (geographic setpoints). In terms of geospatial analysis with extracted values (e.g., tabular data), the system can additionally or alternatively extract key geometric data from TLLs. That geometric data may include, as examples, distance from luminaire to sidewalk, height of luminaire, distance to road center, road type and/or width, and presence of a sidewalk on the opposite side. Both methods for training a model can be used to achieve similar results and might even be used in combination in certain non-limiting instances.

Additionally, both methods offer notable advantages. One advantage is faster design since the methods above can recommend suitable lighting solutions at a high rate of speed. Another advantage is cost efficiency. Yet another advantage is energy savings and reduced emissions since, by optimizing lighting to match the geographic setpoint, the system can help reduce energy consumption and CO2 emissions. As still another advantage, improved service is realized since, ultimately, these methods can contribute to providing a better lighting experience for users.

Now in terms of local hardware vs remote software examples, note that while examples above focused on optimizing horizontal illuminance for outdoor lighting, present principles may be extended to a broader range of other scenarios. To illustrate this, two contrasting approaches to lighting control will now be explored. The first approach involves local hardware control—In this scenario, the lighting performance may be determined by the physical hardware on-site, such as the luminaire itself and its photocell sensor. The machine learning model as applied here may be trained to analyze this local setup and recommend adjustments for optimal lighting based on preset parameters for the luminaire/hardware. The second approach involves remote software control—In this scenario, a remote software-based system may include a central management system (CMS) that controls the performance of the luminaire. The machine learning model may be used within this system to analyze data and send instructions to the luminaires, optimizing lighting remotely by changing color, intensity, etc.

These two examples showcase the versatility of present principles. The machine learning model(s) disclosed herein can be adapted to various lighting control systems, from those relying solely on local hardware to those managed by a central software platform.

As mentioned a few times above, while examples above focus on horizontal illuminance, which relates to the amount of light reaching the ground, it is reiterated that this is just one aspect of lighting design, and that geographic setpoints and other principles set forth herein can be applied to other lighting metrics as well. To wit, various other example factors that may be considered when designing a lighting scheme using a trained ML-based model as described herein may include photometric quantities for vertical illuminance and luminance. In terms of vertical illuminance, this may refer to the amount of light hitting vertical surfaces, such as the side of a building or a pedestrian's body. In terms of luminance, this metric may refer to the perceived brightness of a surface that reflects light from the streetlight. These and other qualitative factors may all play a role in determining the optimal lighting solution for a specific location and are encompassed by present principles.

Thus, a model deployed consistent with present principles may consider multiple metrics simultaneously as part of the same evaluation process (e.g., for a given streetlight configuration). Training data and machine learning models can therefore be created using the principles set forth herein to account for various lighting goals. For instance, a model may be trained to achieve ten lux horizontal illuminance on the road surface at an intersection (ensuring good visibility for drivers) as well as ten lux vertical illuminance at crosswalks (providing adequate lighting for pedestrians). By incorporating multiple metrics, the system can create lighting solutions that are highly optimized for the specific needs of a given geographic area.

The two scenarios presented above (local hardware vs. remote software control) represent opposite ends of a spectrum. But note that in other real-world applications, lighting control solutions as described herein may involve a nuanced balance between these extremes. For example, local hardware with limited options might be used since some luminaires offer basic controls like physical switches to adjust light distribution during installation. These settings might remain unchanged throughout the luminaire's lifespan. But in other examples, a luminaire might be used where a user can define the way the luminaire will perform in the field. Hybrid control systems are also encompassed by present principles, offering a hybrid approach. Thus, remote software systems (CMS) can manage power levels (dimming and intensity), while color and distribution settings may be determined by the physical hardware on-site. However, in other instances color and distribution may be controllable through remote software as well.

Remote software ancillary priorities-Further note that while these systems control lighting, they may also be involved in the management of other Internet of things (IoT) solutions which often share space and electricity on a streetlight pole. Examples of these IoT solutions include cameras, municipal WiFi networks, license plate readers, shotspotters, etc.

Figure 11C:
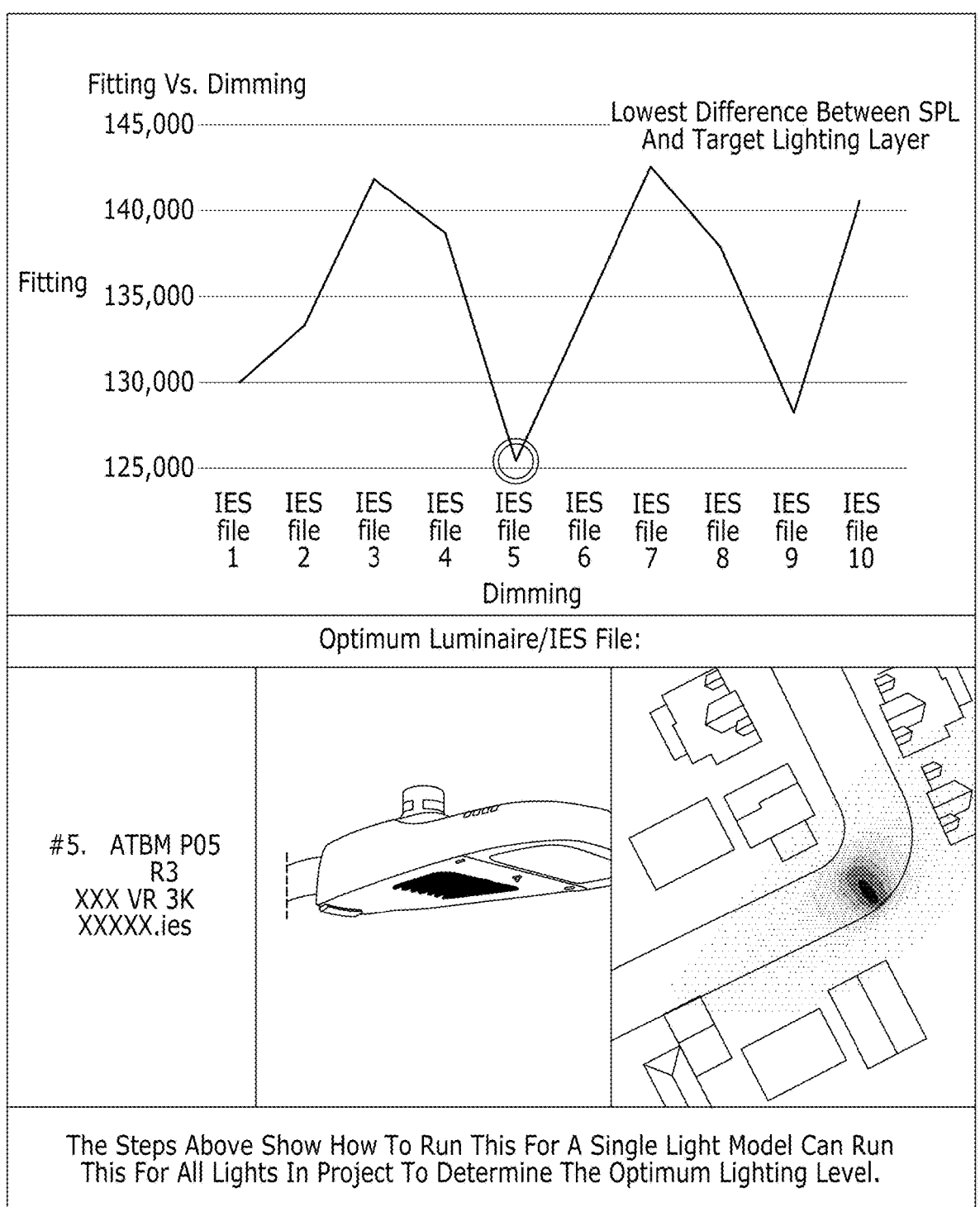

FIGS. 11A-C show a schematic that further illustrates in the form of a local hardware-based approach where the local hardware that is installed directs the performance of the lighting. The table below the street scheme image demonstrates that multiple luminaires may be chosen for evaluation by a model trained consistent with present principles to find the one that best matches its substantive performance with the TLL. Raster analysis may therefore be done on each one. For each luminaire/IES file, light may fall on the ground differently at this geographic location. The local hardware that is installed is the only tactic to control the luminaire in this non-limiting example. Also note per FIG. 11 that the images on the bottom row of the table are different. Each displays the amount of light that would fall on the ground at the relevant geographic location according to different dimming levels for the hardware luminaire. Each cell in the one-band absolute raster has a value, and the optimum lighting may be the one with the lowest values overall. As may be appreciated from FIG. 11C in particular, IES file number five has the lowest difference between SPL and TLL. FIG. 11C also shows data related to IES file five in greater detail.

Figure 12:
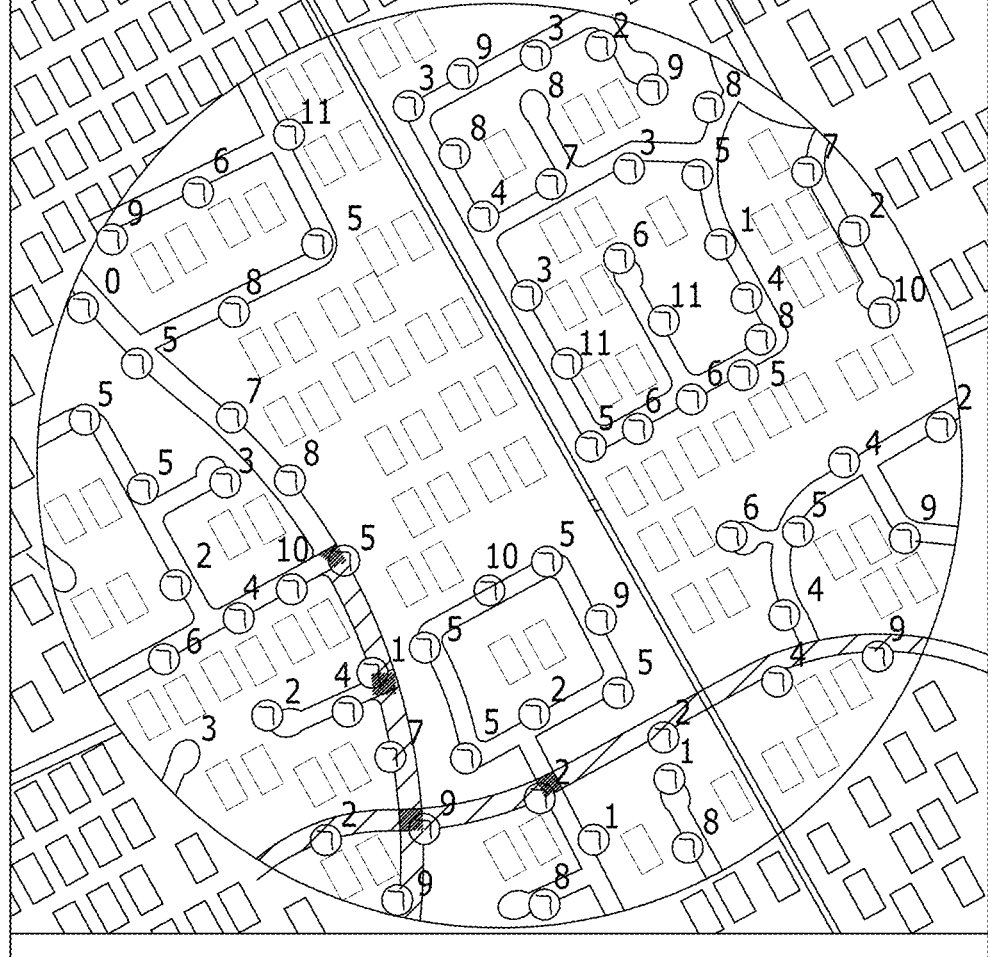
FIG. 12 is a schematic diagram of a first example street-light layout for a municipality consistent with present prin-ciples.

Note that FIGS. 11A-C show how present principles may be applied for a single streetlight, but the model can run this type of process for all lights in a given project/municipality to determine the optimum lighting level for each streetlight in a given geographic area, as represented in FIG. 12. FIG. 12 thus illustrates an example where ten IES files were used along with one "no fixture installed" option to determine the Luminaire/IES file which most closely matches the Target Lighting Layer at each location denoted by a respective circle on the image. The numbers above match the chosen luminaire/IES files.

Furthermore, in some examples the image in FIG. 12 may be an interactable GUI so that an end-user (e.g., government official or other municipality officer) may select a given circle from the map that corresponds to a given streetlight. In response to selection of a given circle, a pop-up window may be presented over part of the map, proximate to the selected map location, to indicate the optimal hardware/software configuration determined by the model itself.

The foregoing processes can be applied to a wide range of locations with unique characteristics. By analyzing numerous real-world scenarios with different IES files, the model can identify clear patterns. For instance, consider an example of a straight residential street with sidewalks. The optimal IES file for this situation might prioritize casting light down the street, perpendicular to the mast arm, in both directions, minimizing light spillover onto private properties on either side. This will more closely align with the target lighting layer (TLL) where the desired illumination level is set to zero for those areas.

As the model analyzes more locations and IES files, the model can develop a comprehensive understanding of how specific lighting configurations interact with different environments to achieve optimal results.

Figure 13A:
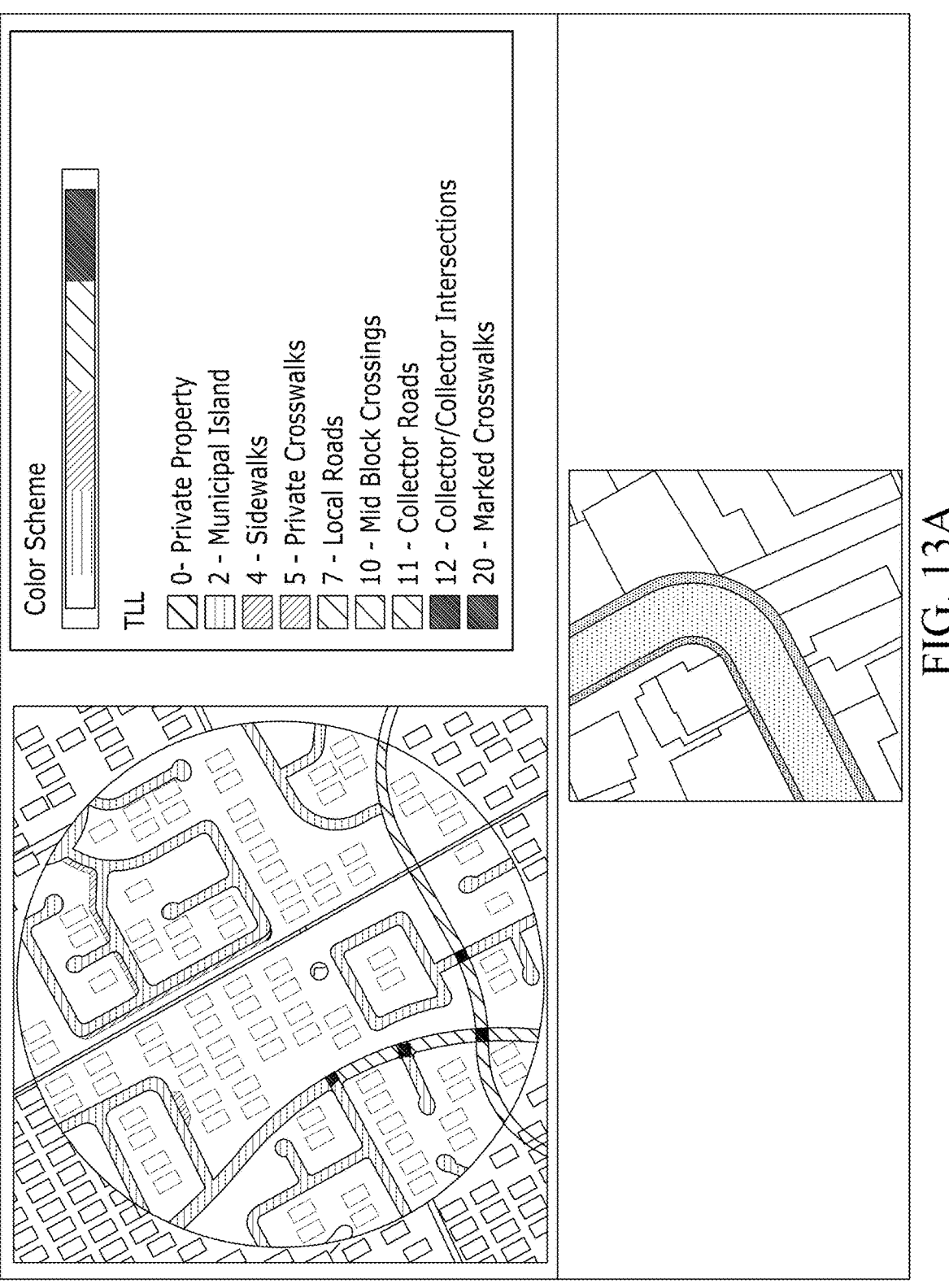
FIGS. 13A-13C are schematic diagrams and accompany-ing tables showing various aspects of a second example implementation consistent with present principles.
Figure 13B:
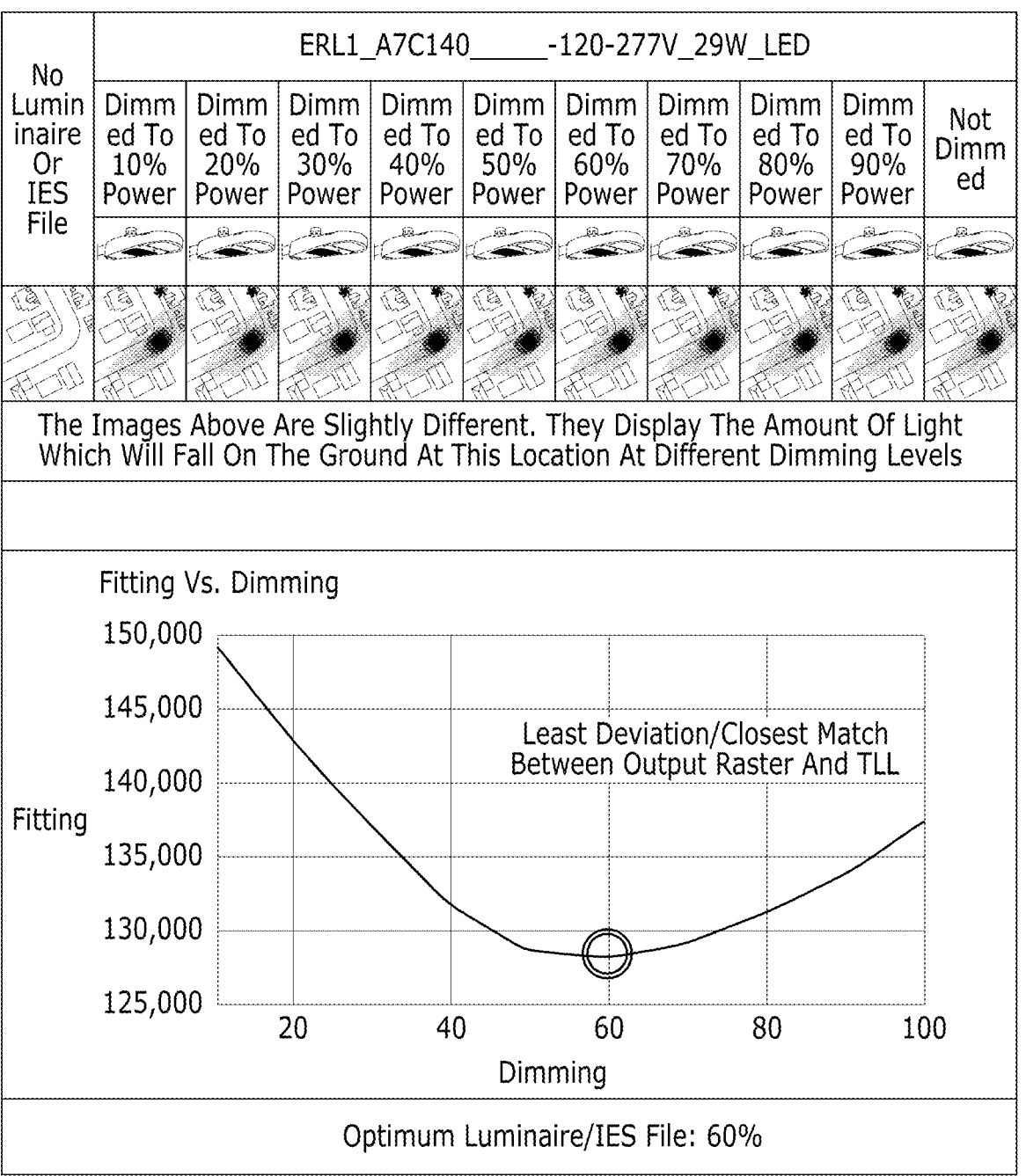
Figure 13C:
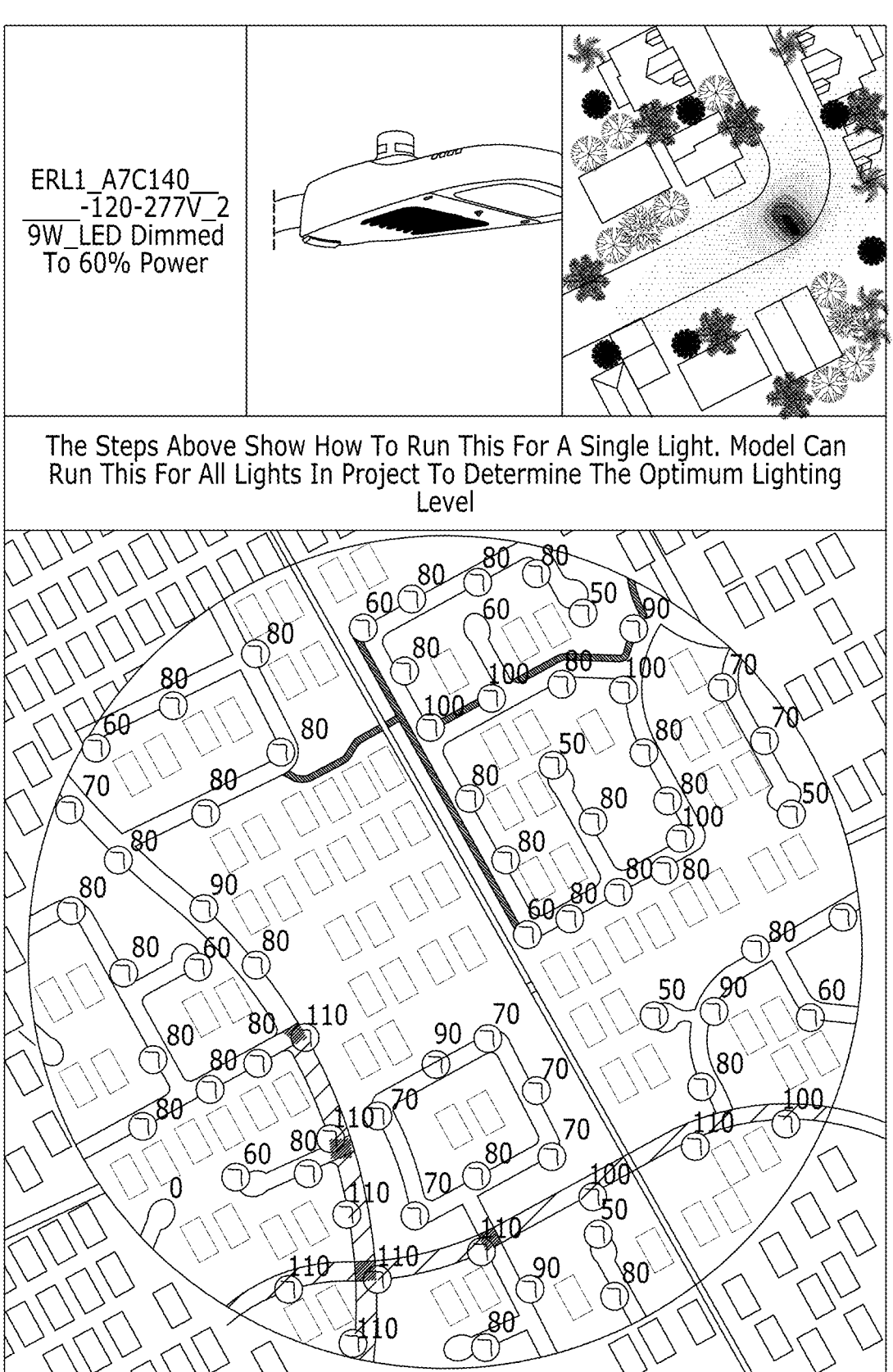

FIGS. 13A-C show a drawing that further illustrates in the form of a remote software-controlled performance-based approach where the luminaire's software is remotely controlled to direct the performance of the lighting. Suppose a luminaire with capabilities to dim, change color, and adjust its light distribution remotely via software control. A control system operating a model consistent with present principles may act like a conductor, directing the luminaire to perform for optimal results based on specific needs.

Multiple lighting metrics—While this example focuses on horizontal illuminance (amount of light on the ground, measured in lux), other lighting metrics might also be accounted for, including vertical illuminance (e.g., the amount of light hitting vertical surfaces such as a building facade or a pedestrian's body) and luminance (e.g., the perceived brightness of a surface reflecting light).

Accordingly, similar to horizontal illuminance, the system can establish target lighting levels (geographic setpoints) for these metrics as well. In many cases, achieving optimal lighting will involve considering a combination of these factors. For example, the system might aim for specific vertical illuminance levels on crosswalks for pedestrian safety, while also meeting horizontal illuminance targets on the road surface.

Finding the optimal software settings-Suppose the system has a luminaire in the field that can be selectively dimmed between 0% to 100% power. The control system may analyze the situation and send instructions to the luminaire for optimal performance based on a temporary or persistent TLL specified by the municipality. In this example, the system might adjust a single IES file to represent the performance of the luminaire at different dimming levels. The system can create variations at 0%, 10%, 20%, and so on, up to 100%. This may in effect provide the system with multiple IES files, each representing a different dimming level. In order to further the precision, the system may re-execute the process described herein with values in different units. So if the first run resulted in 60% power resulting in the lowest absolute difference when increments of ten were considered, the system may then refine itself by analyzing at five-increment percentages of 55, 56, 57 . . . 60 . . . 63, 64, 65 to identify the closest match with more precision after analyzing in increments of ten percent. The process may continue, doing increments of one percent and even a tenth of a percent and so on.

By comparing these variations with the target lighting level (TLL), the system can therefore identify the optimal dimming level. The inferred setting in this example may be selected that delivers the illumination closest to the desired target, minimizing the difference between what's requested per the TLL and what's actually happening in terms of substantive performance. In the example provided, this might include running the luminaire at 60% power, achieving the target illumination with 40% dimming.

Figure 14:
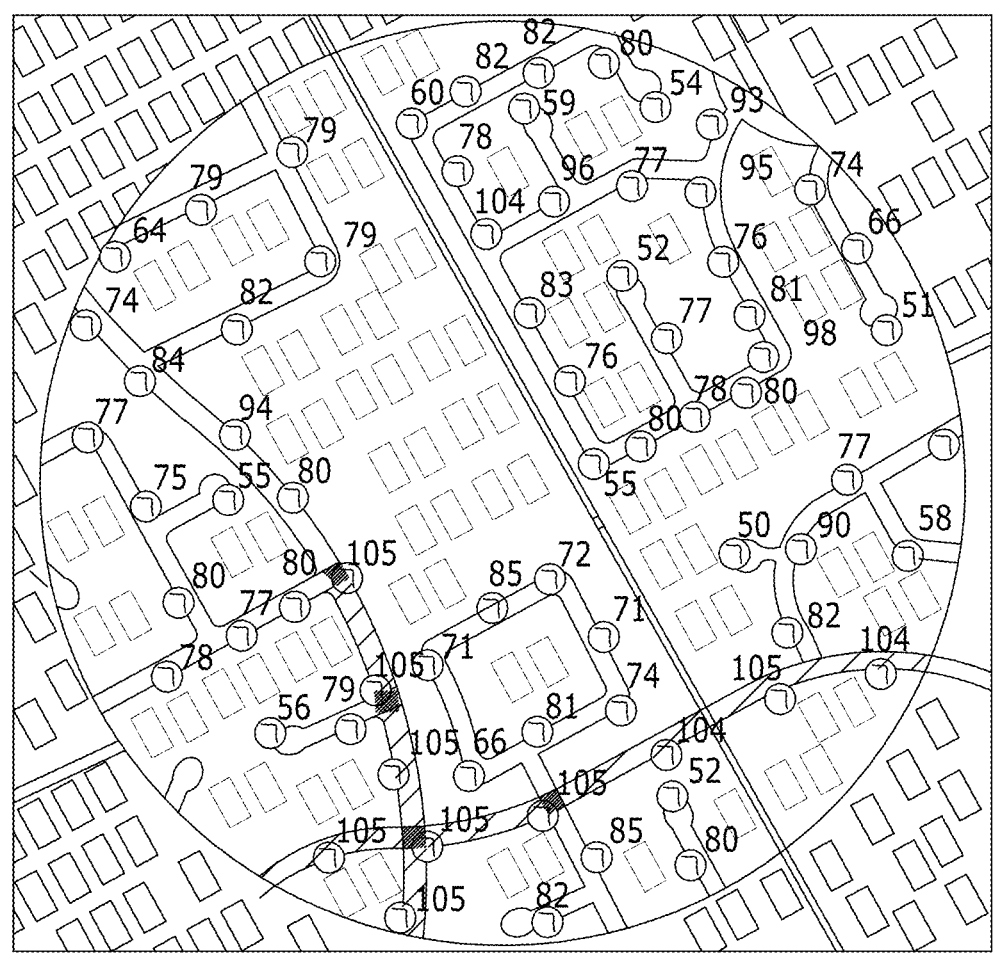
FIG. 14 is a schematic diagram of a second example streetlight layout for a municipality consistent with present principles.

FIG. 14 further illustrates the example of FIGS. 13A-13C. Thus, eleven IES files were used to determine the optimum lighting level to the closest 10% (tens) for each streetlight on the map. The system then ran through the same steps again to use the results from above using another 11 IES files (tens−5) to (tens+5). If the tens analysis results in 60, then the system would evaluate 55, 56, 57, 58, 59, 60, 61, 62, 63, 64, 65 to determine the closest 1% (units) as shown in FIG. 14. The system can continue to get more precise by using the same methodology to evaluate (0.1%) tenths, (0.01) hundredths, (0.001) thousandths place.

Moving on from FIG. 14 and in terms of overlapping luminaire beamspread/distribution for multiple lights, but where a TLL is still to be met as closely as possible, note that the process may become more complex when dealing with multiple luminaires that cast overlapping light patterns. Here, instead of comparing a single luminaire's performance to the target lighting level (TLL), the system may consider all possible combinations.

To demonstrate the model/engine at work for this scenario, note that this same engine can be used to evaluate all these permutations for the overlapping light instance. This applies to both scenarios-local hardware control and/or remote software control. Local hardware—in this case, the engine would evaluate every possible combination of settings for each luminaire with overlapping beams. Remote software control-here, the engine may compare all possible combinations of dimming levels for both luminaires. As the number of luminaires and the desired level of precision increase, the number of permutations to be evaluated also grows.

Further note that in many real-world scenarios, there may be a combining of local (hardware) and remote (software) control, so each hardware/software combination that is possible may be analyzed by the system. Indeed, there are many practical situations where local hardware and remote software control might be evaluated together. Imagine decorative fixtures with fixed settings (local hardware) overlapping with streetlights controlled by remote software. In this case, the system may compare all possible combinations of decorative fixture options with all dimming level variations for the streetlights. The goal of the system is to identify the best combination that achieves optimal lighting performance based on the TLL.

Overlapping beamspread may be further illustrated through a certain analogy in that the challenge of optimizing lighting with overlapping beamspreads may be like finding the most efficient route for a person visiting multiple cities. But in the present instance, with two overlapping luminaires, the system has a "2-opt" problem to solve, where the system would optimize the combination of the two light sources used together. As the number of luminaires increases beyond two, the problem becomes more complex ("3-opt" for three luminaires, and so on), but a model trained consistent with present principles can still handle this efficiently and seamlessly.

Figure 15:
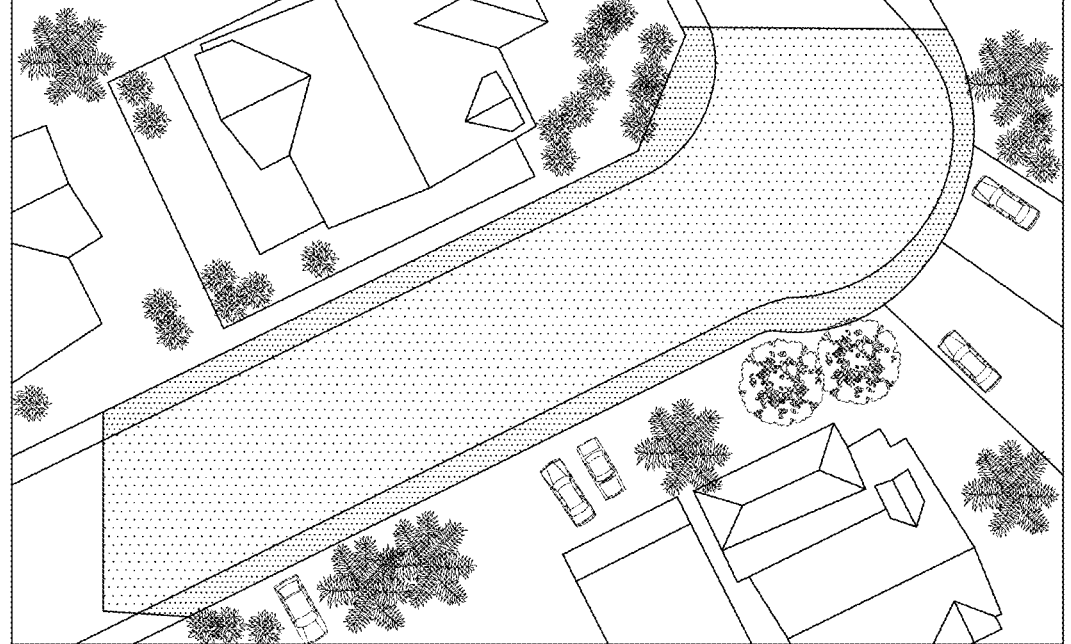
FIG. 15 is a schematic diagram of a street where two streetlights provide light to a common area on the street consistent with present principles.

Now in reference to FIG. 15, suppose there are two luminaires in the space shown in this figure. All of the permutations of both luminaires may be analyzed by the model to determine which one best matches the Target Lighting Layer when light overlaps and hits the same.

Figure 16A:
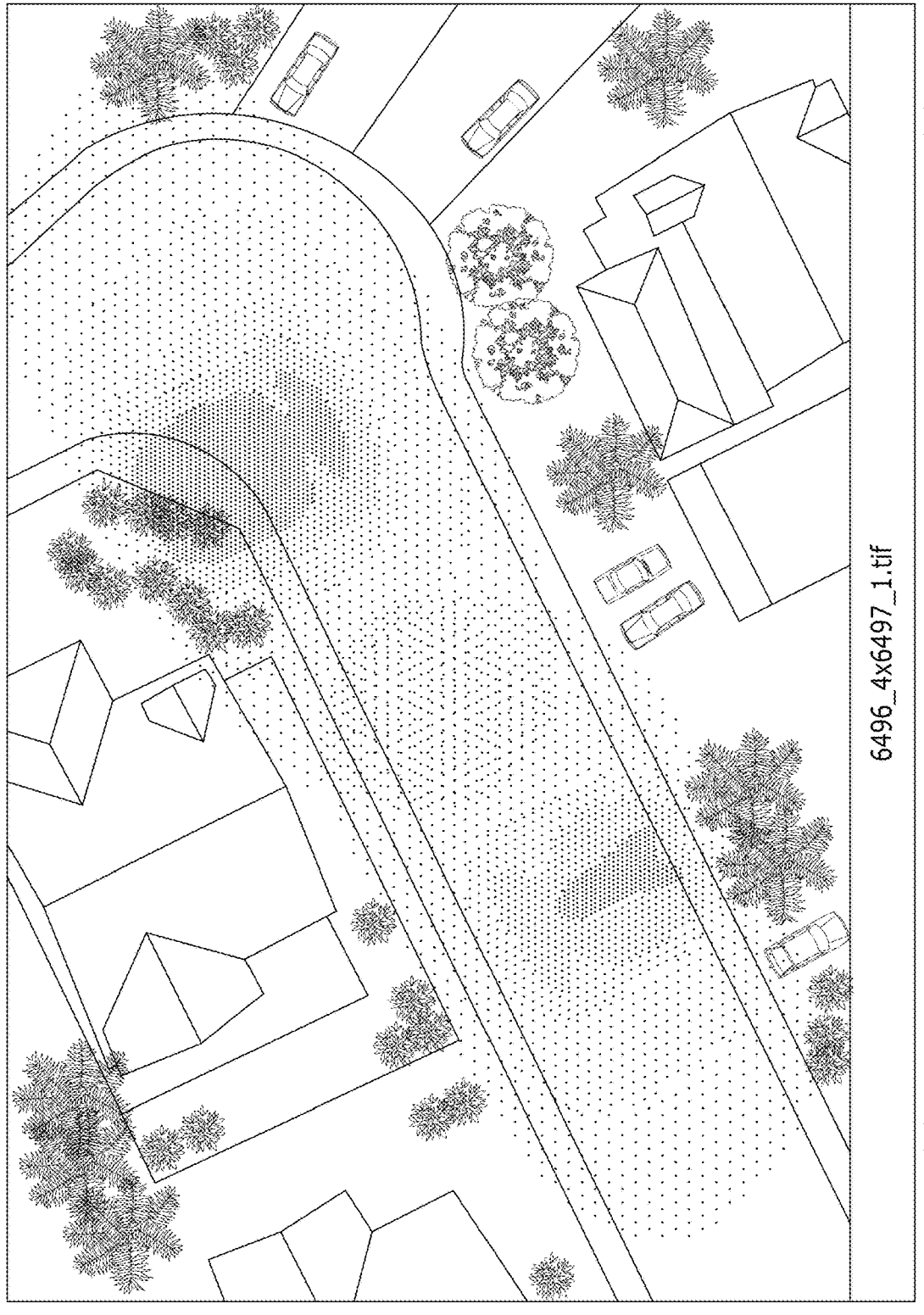

FIGS. 16A and 16B shows an example of 6496_4× 6497_1.tif file. The problem for the model to solve here relates to which of the 132 permutations in the table of FIGS. 16A-B matches the TLL the best. In order to save space, these figures are not inserting a thumbnail of each one, but each one would indeed be provided to the model itself. Also note that from a processing perspective, it may be valuable to run the data in smaller groups, such as 4×4 instead of 11×11.

Figure 17:
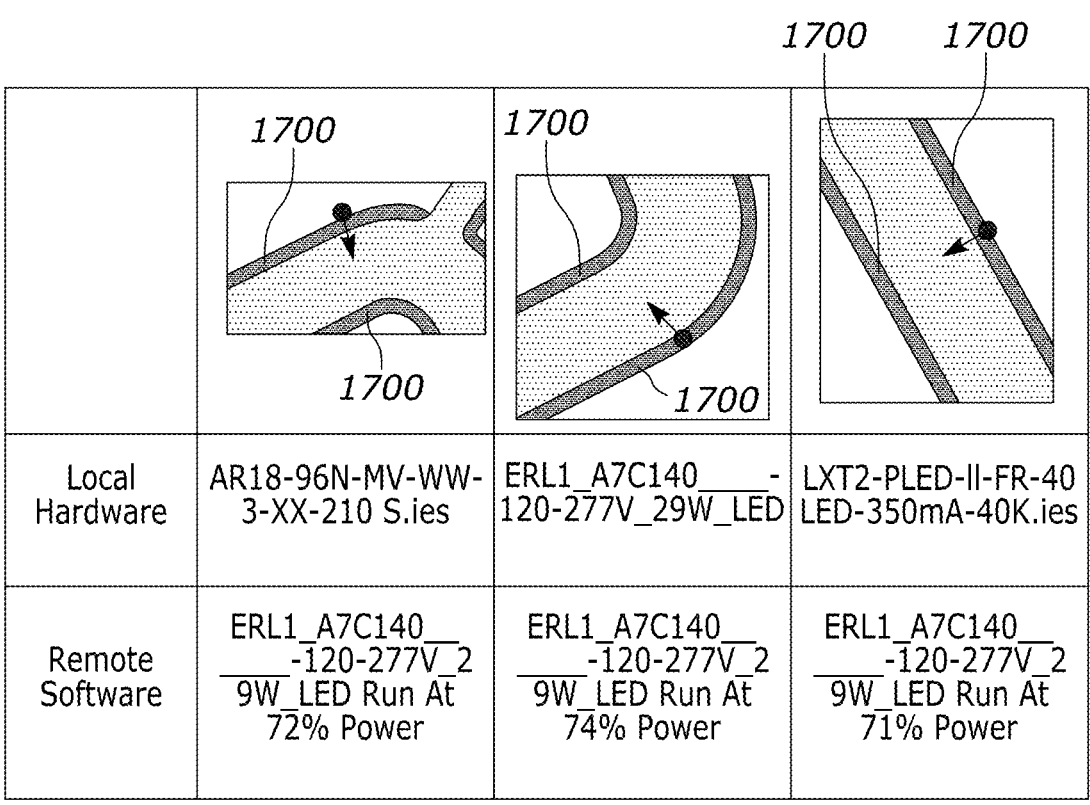
FIG. 17 is a schematic diagram illustrating different machine learning model inferences that may be output for different streetlights of different orientations consistent with present principles.

Now in reference to FIG. 17, machine learning inputs and results are demonstrated. In the images of FIG. 17, three examples are shown of example training data along with the luminaire and direction. Green areas (designated by elements 1700 in FIG. 17) are seven lux, brown areas may be four lux, gray may be zero lux (night light). FIG. 17 therefore shows the IES file (ERL1_A7C140_____-120-277V_29_W_LED) should be run at 72, 74 and 71% power, respectively.

Figure 18:
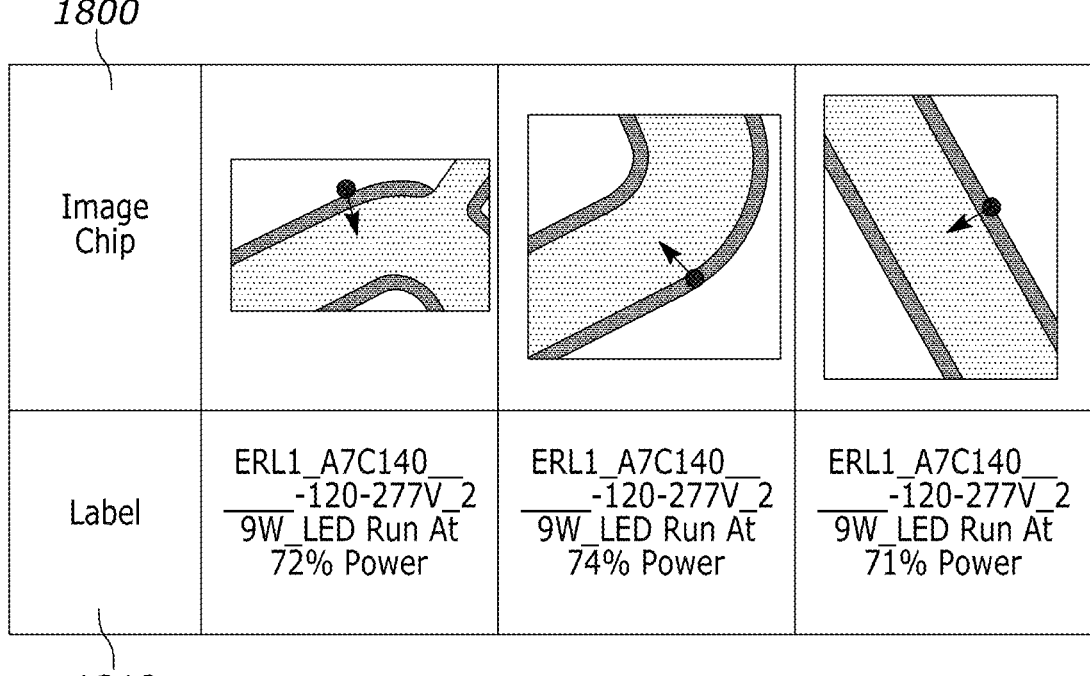
FIG. 18 is a schematic diagram that illustrates a dataset for model training consistent with present principles.

Continuing the detailed description in reference to FIG. 18, this figure illustrates a dataset for model training consistent with present principles. A supervised machine learning model may therefore be trained with image chips 1800 and respective labels 1810 as shown below. Each image chip may specify target lighting levels (expressed in colors on the map), direction of mast arm (expressed by direction of arrow), height of the pole (expressed in size of point for the light from which the arrow originates), and length of mast arm (expressed as length of the arrow). The labels 1810 in the example shown indicate the optimum lighting level for the same luminaire—ERL1_A7C140_____-120-277V_29W_LED but run at different power levels given the differently-shaped streets (and potentially other metrics).

Training the model therefore enables the system to determine lighting levels, which luminaire to use, or a combination of these characteristics in a highly efficient, energy-saving manner, demonstrating significant computer-based technological advancements. Once the machine learning model is trained, the system may therefore be able to enter images similar to the ones in FIG. 18 as input and quickly get a label which is then provided as output to the user. This will enable the system to design outdoor lighting more effectively and more quickly.

Figure 19:
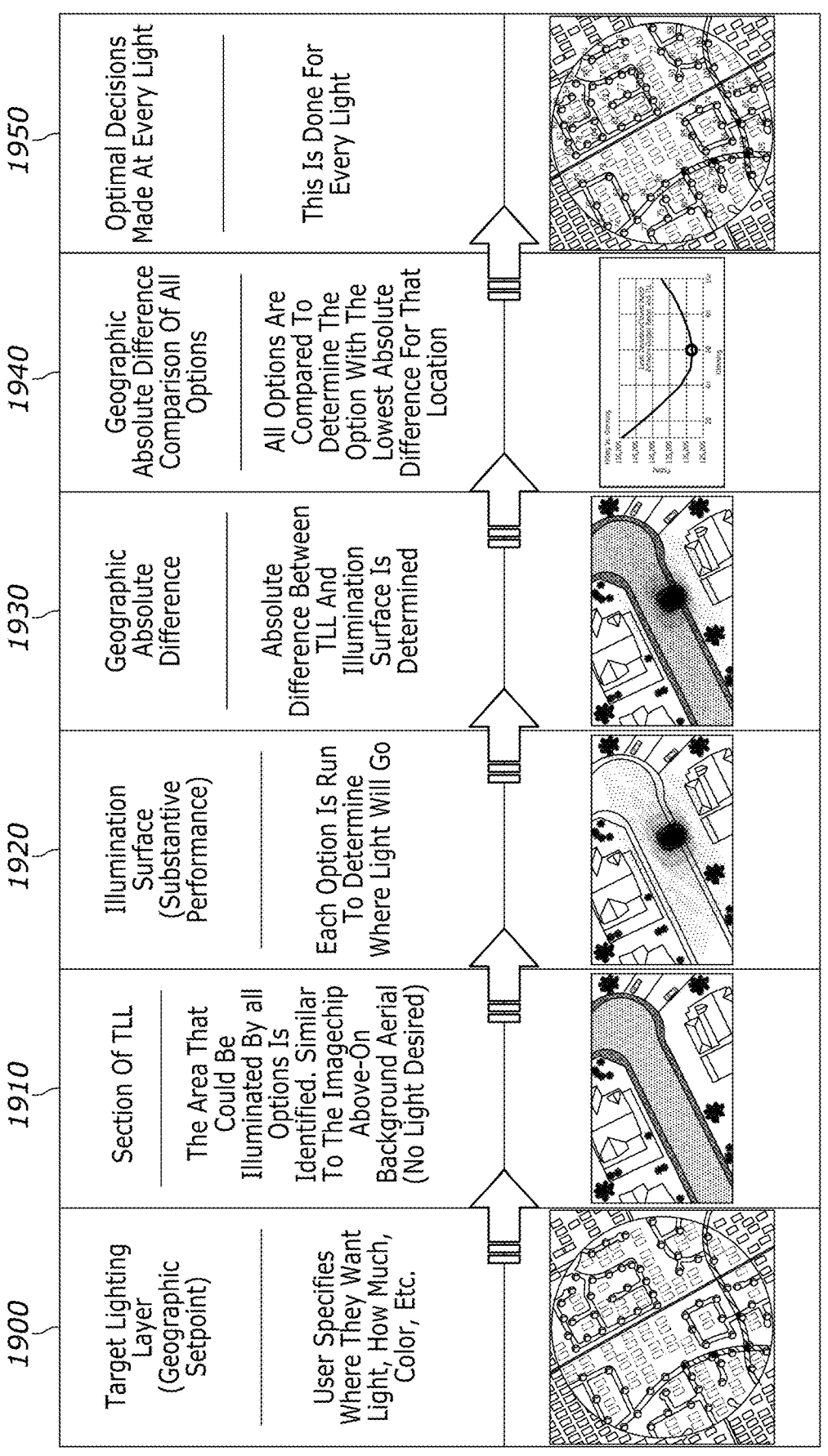
FIG. 19 schematically illustrates a process flow to deter-mine labels for the training images of FIG. 18 consistent with present principles.

FIG. 19 schematically illustrates a process flow to determine labels for the images of FIG. 18 (72%, 74% and 71% power, respectively). At step 1900, through a TLL, the user specifies where they want light, how much, what color, etc. Then at step 1910, via sections of the TLL, the area that could be illuminated by all options is identified. Similar to the image chips of FIG. 18, no background aerial (areas where no light is desired) is also shown.

Then at step 1920, illumination surface (substantive performance) is determined. Each option may therefore be run to determine where the light will actually go in the real world. Then at step 1930 the geographic absolute difference is determined. Again this may be the absolute difference between the TLL and illumination surface. At step 1940 a geographic absolute difference comparison of all options is performed. Thus, all options are compared to determine the option with the lowest absolute difference for that location. Then at step 1950 optimal decisions are made for every light in a given geographic area (e.g., defined by the user).

Moving on from FIG. 19, note that in some particular examples, the pixel values for a given raster may range from zero to twenty, though other ranges may also be used.

Also note in terms of the color-coded maps referenced herein that no light areas may be represented as transparent while small amount of light areas may be represented as white.

In terms of desired lux (e.g., setpoint) for different types of areas, in various example implementations, sidewalks may receive around four Lux, local roads may receive around seven lux, mid-block crossings may receive ten Lux, collector streets and bike lanes may receive eleven Lux, collector/collector intersections may receive twelve Lux, areas directly below the luminaire may receive fourteen lux, and marked crosswalks may receive twenty Lux.

It may now be appreciated that machine learning models and training data may be created. The AI model may include grouped characteristics of the luminaire in the field (Lighting Distribution types—1, 2, 3, 4, 5, etc., BUG ratings, wattage, color of the luminaire in 3D space (XYZ), and other aspects.

Additionally, note that the dimming/intensity performance metric as disclosed herein may sum the values between overlapping beamspread. The color/tuning performance metric may average the values in overlapping beamspread. The distribution performance metric may evaluate the smallest and largest beamspread and adjust by increments.

As also noted above, a user may create or edit the Target Lighting Layer by editing a street map consistent with the disclosure above. There may even be a mapping website which enables users to edit TLLs. Polygons per FIGS. 12 and 14 may correlate to specific illumination levels (in Lux) on the ground. For example, purple areas might specify eleven LUX on the ground. The numbers in these maps may establish the intensity/dimming results. Generally, lighting on cul-de-sacs might be run lower and those on major streets or close to crosswalks may be run higher. In one example instance, twenty percent energy savings may be realized for electricity used for street lighting.

Again note that local streetlight hardware may refer to the items installed in the field (onsite) which directs the performance of the luminaire. This may include the photocell and the luminaire which directs the performance. To reiterate in terms of remote software, this may include a remote system (not onsite with the streetlight) which directs the performance of the luminaire itself. These systems may be referred to as a Controls Management System (CMS) or Lighting Management System (LMS). They may also be used to manage Internet of Things solutions, such as cameras, license plate readers, gunshot detectors, municipal Wi-Fi networks which share the pole and electricity with the outdoor lighting.

Indeed, present principles recognize that AI training sets can take many forms, sometimes provided in the form of a table, in images, video, audio etc. In some instances, an image may be converted into something that could be included in a table. For example, an image may show a target lighting layer which includes streets, sidewalks, and private property with the streetlight. This could be turned into records in a table by determining the distance from the luminaire to the street centerline, back curb, forward curb, etc., numerically describing the variables representing the image.

Also note that while lighting examples have been discussed above, AI training data and the trained models themselves may apply to other uses of geographic setpoints. Supervised and unsupervised machine learning may be used. While horizontal illuminance has often been discussed above, present principles may apply to all geographic-based photometrics, such as vertical illuminance, color, and distribution. Additionally, certain examples may use cobrahead luminaires, but present principles may apply to all luminaires, such as decorative ones. What's more, while hardware-only and software-only implementations may be referenced at certain points, other examples for inferring an optimal streetlight configuration may relate to a hardware/ software combination configuration. Still further, while certain examples have been described as using IES files, other types of files used in photometric analysis may also be used. Moreover, while certain examples might use real images/ data, other examples may additionally or alternatively use synthetic images/data to train the model. Further, as mentioned above, while certain examples use images as input, other examples may use other methods of describing the Target Lighting Layer and/or Substantive Performance Layer.

As also mentioned above, while a two-light overlapping beamspread might be considered in certain instances, beamspreads from three or more streetlights may also be considered. Additionally, while certain examples may include two overlapping beamspreads and calculations done for horizontal illuminance, present principles may be applied to other photometric calculations, such as vertical illuminance or luminance. Certain examples may use feeding images into a Custom Vision/ML algorithm, but present principles may also include feeding image chips into the algorithm.

Deep learning training samples consistent with present principles may be established by relatively small sub-images (e.g., image chips), and may contain the feature or class of interest.

Providing an example beyond streetlighting, as mentioned above, present principles may be applied to density implementations. Imagine a city aiming to boost population density by adding housing units within a specific timeframe. To achieve this, they create a map outlining targeted density zones across the city. They also possess data on existing buildings, including details like age, construction materials, and current land use. An older wooden building in a residential area is a more likely candidate for renovation and conversion into additional units compared to a newer concrete building in a commercial zone.

As development proposals are submitted and units are added, the city analyzes the impact on their overall goals. Projects that significantly decrease the potential to reach target densities are less likely to get approved. Importantly, even projects which add units create new buildings, potentially reducing the availability of land for future high-density developments.

Given the city's need for speed and cost-effective project approvals, the city may use a machine learning model consistent with present principles. The model may leverage the target density map to quickly assess proposed projects. By analyzing the location and details of a proposal, the model can predict whether a given option will increase or decrease the likelihood of achieving the desired density in a specific area.

As another example, present principles might even be applied to thermostats that adjust settings based on location. Here a trained model may use a map with different temperature goals for different neighborhoods or regions. Goals might vary as some areas might have a higher capacity for microgrids (systems combining solar panels and batteries) which can handle adjustments in energy demands caused by varying thermostat settings.

Present principles may also be used for smart vehicle cruise control systems, where the setpoint speed of the vehicle adapts speed based on specific geographic features like winding roads, school zones, and/or congested areas. This information may thus be compiled on a map as geographic setpoints for a model trained consistent with present principles to analyze.

Municipalities and other organizations may therefore harness present technology by creating training data based on these types of geographic setpoints. They could then use customized machine learning models that provide real-time feedback to multi-location thermostats, optimizing energy use, and even automatically adjusting cruise control speeds for enhanced safety and efficiency.

Additionally, while certain aspects above focus on using real-world geographic data (target lighting layers) to train a machine learning model for lighting design, "typical layouts" may also be considered. Thus, outdoor lighting designers may create standardized layouts representing common road configurations. These layouts may consider factors like number of lanes, road width, luminaire height, mast arm length, presence of features like bike lanes or medians, etc. These layouts may serve as a starting point for designing lighting in specific locations using a model consistent with present principles.

Thus, in terms of leveraging models and training as disclosed herein for standardized or city-agnostic layouts, training may be done with variations. For instance, the model may be trained using variations of such layouts. This might involve iteratively widening roads, raising luminaires, or adding/removing features.

Then in terms of matching those layouts to real-world scenarios, a first option might be streamlining design for existing layouts: The trained model may then analyze real-world lighting scenarios and match them to the closest "typical layouts." This could suggest optimal lighting configurations based on similar layouts already analyzed, streamlining the design process. As a second option, optimization may be done for specific features in that the model may directly recommend solutions for real-world features, considering factors like road width and presence of bike lanes.

Also in terms of this alternative implementation for "standardized layouts", this non-limiting example approach might not use real-world (or synthetic) geographic data (target lighting layers) as input for the model as described in other examples above. Instead, it may rely on pre-defined, standardized layouts that lack geographic context, though not as optimal as other approaches discussed above.

Additionally, while sensors like environmental sensors (detecting real-time conditions like rain and adjust lighting performance accordingly), traffic or pedestrian sensors, and air quality sensors might be used in some instances for adjusting street lighting, these sensors do not directly interact with geographic information and are not based on pre-defined geographic lighting layers. So geographic aspects should be considered in many cases consistent with present principles to realize the technical improvements set forth herein.

As an example, a remote software system could access weather data (rain) based on the luminaire's location (latitude/longitude). If rain is detected, the system could adjust lighting performance to match a pre-defined "raining" target lighting layer stored in the supervised learning model. In this scenario, the use of geographic data (weather based on location) to adjust lighting aligns with other aspects mentioned above.

Moving on to another aspect encompassed by present principles elevation data may be considered. Elevation data, available globally with varying levels of detail and accuracy, may therefore play a crucial role in outdoor lighting design. This data may come two formats-Digital Elevation Models (DEMs) (depicting bare earth, a grid that excludes features like buildings, trees, and power lines), and Digital Surface Models (DSMs) (including all surface features in the landscape).

In terms of elevation data in Training AI models consistent with present principles, note that when creating training data for machine learning models used in lighting design, elevation data may indeed be a notable a factor. In some cases, using a flat elevation might be computationally efficient for processing purposes. However, for optimal results, actual terrain variations may be accounted for. Indeed, many outdoor lighting fixtures have an asymmetric beam pattern, meaning they cast light unevenly in different directions. To prevent light trespass onto private property or unwanted areas, techniques like shields may be used. So in some example non-limiting instances, it may be important to consider these non-standard light distributions, especially in areas with significant elevation changes. So by incorporating elevation data into the training process, the machine learning model can better predict how luminaires with asymmetric beam spreads will perform in real-world scenarios with varying terrain. This allows for more precise placement and configuration of these luminaires, minimizing light trespass and optimizing lighting performance.

Before concluding, it is to be understood that although a software application for undertaking present principles may be vended with a device, present principles apply in instances where such an application is downloaded from a server to a device over a network such as the Internet. Furthermore, present principles apply in instances where such an application is included on a computer readable storage medium that is vended and/or provided by itself, where the computer readable storage medium is not a transitory signal and/or a signal per se.

It may now be appreciated that present principles provide, among other technical improvements, improved computer-based user interfaces that increase the functionality and ease of use of the devices disclosed herein. The disclosed concepts are rooted in computer technology for computers to carry out their functions.

It is to be understood that whilst present principals have been described with reference to some example embodiments, these are not intended to be limiting, and that various alternative arrangements may be used to implement the subject matter claimed herein.

What is claimed is:

1. An apparatus, comprising:
a processor system; and
storage accessible to the processor system and comprising instructions executable by the processor system to:
identify a three-dimensional (3D) location of a streetlight;
identify an orientation of the streetlight;
identify a height of the streetlight relative to ground;
access lighting performance data for the streetlight;

based on the lighting performance data, the 3D location, the orientation, and the height, identify substantive illumination for the streetlight at first and second areas on the ground;
perform interpolation to identify substantive illumination for the streetlight at third and fourth areas on the ground, the first, second, third, and fourth areas being different from each other;
use the substantive illumination of the first, second, third, and fourth areas to generate a substantive performance layer (SPL);
access a target lighting layer (TLL) associated the streetlight, the TLL indicating target illumination for the first, second, third, and fourth areas; and
compare the substantive illumination for the first, second, third, and fourth areas to the target illumination for the first, second, third, and fourth areas to determine an absolute illumination difference between the substantive illumination and the target illumination for each of the first, second, third, and fourth areas;
correlate the absolute illumination differences to a particular lighting configuration for the streetlight;
store together, in electronic storage, the SPL, TLL, and the particular lighting configuration; and
train, using the SPL, TLL, and the particular lighting configuration, a machine learning (ML) model to infer respective optimal lighting configurations for different respective street lights given a desired setpoint for each respective street light.

2. The apparatus of claim 1, wherein the particular lighting configuration for the streetlight relates to one or more of: a particular luminaire to use for the streetlight, a particular software configuration to use for a luminaire of the streetlight.

3. The apparatus of claim 1, wherein the instructions are executable to:
determine the absolute illumination differences using raster calculations that subtract the substantive illumination from the target illumination for each of the first, second, third, and fourth areas.

4. The apparatus of claim 1, wherein the lighting performance data pertains to one or more of: light intensity for the for the streetlight, light color for the streetlight, and/or distribution for the streetlight.

5. The apparatus of claim 1, wherein the orientation of the streetlight is identified from one or more of: an image chip, and/or tabular data.

6. The apparatus of claim 1, wherein the lighting performance data is accessed via a file in a photometric file format.

7. The apparatus of claim 1, wherein the streetlight is a first streetlight, and wherein the instructions are executable to:
during deployment of the ML model, execute the ML model to determine a particular hardware configuration for a second streetlight different from the first streetlight.

8. The apparatus of claim 1, wherein the streetlight is a first streetlight, and wherein the instructions are executable to:
during deployment of the ML model, execute the ML model to determine a particular software configuration for a second streetlight different from the first streetlight.

9. The apparatus of claim 1, wherein the streetlight is a first streetlight, and wherein the instructions are executable to:

during deployment of the ML model, execute the ML model to determine both a particular hardware configuration for a second streetlight and a particular software configuration for the second streetlight, the second streetlight being different from the first streetlight.

10. The apparatus of claim 1, wherein the instructions are executable to:

train the ML model using a dataset that comprises plural data pairs, each data pair comprising a respective SPL, a respective TLL, and a respective lighting configuration.

11. The apparatus of claim 1, wherein the instructions are executable to:

generate a dataset to train the ML model, the dataset comprising plural data pairs, each data pair comprising a respective SPL, a respective TLL, and a respective lighting configuration.

12. The apparatus of claim 3, wherein the SPL establishes a first image, and wherein the TLL establishes a second image, the first and second images being used for the raster calculations.

13. The apparatus of claim 3, wherein the SPL establishes a first pixel value, and wherein the TLL establishes a second pixel value, the first and second pixel values being used for the raster calculations.

14. The apparatus of claim 9, wherein the instructions are executable to:

based on the determination of both the particular hardware configuration and the particular software configuration, present a graphical user interface (GUI) on a display, the GUI indicating the particular hardware configuration and the particular software configuration, the GUI being presented as part of software to control the ML model, the software being executable to indicate a desired TLL during deployment and to present the GUI.

15. The apparatus of claim 10, wherein each data pair minimizes an absolute illumination difference between the respective SPL and respective TLL via the respective lighting configuration.

16. The apparatus of claim 10, wherein the ML model comprises an artificial neural network.

17. The apparatus of claim 11, wherein the respective streetlight configuration establishes a label for the respective data pair.

18. The apparatus of claim 11, wherein the instructions are executable to:

select a respective data pair for inclusion in the dataset based on the respective SPL and respective TLL minimizing a respective absolute illumination difference between the respective SPL and respective TLL via the respective lighting configuration.

19. A method, comprising:

identifying a three-dimensional (3D) location of a streetlight;

identifying an orientation of the streetlight;

identifying a height of the streetlight relative to ground;

accessing lighting performance data for the streetlight;

based on the lighting performance data, the 3D location, the orientation, and the height, identifying substantive illumination for the streetlight at first and second areas on the ground;

performing interpolation to identify substantive illumination for the streetlight at third and fourth areas on the ground, the first, second, third, and fourth areas being different from each other;

using the substantive illumination of the first, second, third, and fourth areas to generate a substantive performance layer (SPL);

accessing a target lighting layer (TLL) associated the streetlight, the TLL indicating target illumination for the first, second, third, and fourth areas; and comparing the substantive illumination for the first, second, third, and fourth areas to the target illumination for the first, second, third, and fourth areas to determine an absolute illumination difference between the substantive illumination and the target illumination for each of the first, second, third, and fourth areas;

correlating the absolute illumination differences to a particular lighting configuration for the streetlight;

storing together, in electronic storage, the SPL, TLL, and the particular lighting configuration; and training, using the SPL, TLL, and the particular lighting configuration, a machine learning (ML) model to infer respective optimal lighting configurations for different respective street lights given a desired setpoint for each respective street light.

20. An apparatus, comprising:

at least one computer readable storage medium (CRSM) that is not a transitory signal, the at least one CRSM comprising instructions executable by a processor system to:

identify a three-dimensional (3D) location of a streetlight;

identify an orientation of the streetlight;

identify a height of the streetlight relative to ground;

access lighting performance data for the streetlight;

based on the lighting performance data, the 3D location, the orientation, and the height, identify substantive illumination for the streetlight at first and second areas on the ground;

perform interpolation to identify substantive illumination for the streetlight at third and fourth areas on the ground, the first, second, third, and fourth areas being different from each other;

use the substantive illumination of the first, second, third, and fourth areas to generate a substantive performance layer (SPL);

access a target lighting layer (TLL) associated the streetlight, the TLL indicating target illumination for the first, second, third, and fourth areas; and compare the substantive illumination for the first, second, third, and fourth areas to the target illumination for the first, second, third, and fourth areas to determine an absolute illumination difference between the substantive illumination and the target illumination for each of the first, second, third, and fourth areas;

correlate the absolute illumination differences to a particular lighting configuration for the streetlight;

store together, in electronic storage, the SPL, TLL, and the particular lighting configuration; and train, using the SPL, TLL, and the particular lighting configuration, a machine learning (ML) model to infer respective optimal lighting configurations for different respective street lights given a desired setpoint for each respective street light.

* * * * *